(12) United States Patent
Liaw

(10) Patent No.: US 10,727,237 B2
(45) Date of Patent: Jul. 28, 2020

(54) SEMICONDUCTOR STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 16/247,840

(22) Filed: Jan. 15, 2019

(65) Prior Publication Data

US 2020/0105768 A1 Apr. 2, 2020

Related U.S. Application Data

(60) Provisional application No. 62/737,264, filed on Sep. 27, 2018.

(51) Int. Cl.
| | |
|---|---|
| *H01L 27/11* | (2006.01) |
| *H01L 23/532* | (2006.01) |
| *H01L 23/528* | (2006.01) |
| *G11C 7/18* | (2006.01) |
| *H01L 29/08* | (2006.01) |
| *G11C 8/14* | (2006.01) |
| *H01L 23/522* | (2006.01) |

(52) U.S. Cl.
CPC ............ *H01L 27/1104* (2013.01); *G11C 7/18* (2013.01); *G11C 8/14* (2013.01); *H01L 23/5226* (2013.01); *H01L 23/5283* (2013.01); *H01L 23/53209* (2013.01); *H01L 29/0847* (2013.01)

(58) Field of Classification Search
CPC ............. H01L 27/1104; H01L 27/0207; H01L 27/0924; H01L 27/11; H01L 27/1116; H01L 23/5226
See application file for complete search history.

(56) References Cited

U.S. PATENT DOCUMENTS

| | | | |
|---|---|---|---|
| 8,947,902 B2 | 2/2015 | Liaw | |
| 8,976,573 B2 | 3/2015 | Liaw | |
| 9,349,436 B2 | 5/2016 | Liaw | |
| 9,576,644 B2 | 2/2017 | Liaw | |
| 9,583,438 B2 | 2/2017 | Liaw et al. | |

(Continued)

*Primary Examiner* — Zandra V Smith
*Assistant Examiner* — John M Parker
(74) *Attorney, Agent, or Firm* — McClure, Qualey & Rodack, LLP

(57) ABSTRACT

Semiconductor structures are provided. A memory cell includes a latch circuit formed by two cross-coupled inverters and a pass-gate transistor coupling an output of the latch circuit to a bit line. Each cross-coupled inverter is connected to a VDD line of a first metallization layer. A word line of a second metallization layer is connected to a gate of the pass-gate transistor through a first via over the gate of the pass-gate transistor, a first landing pad of the first metallization layer, and a second via over the first landing pad. A source/drain region of the pass-gate transistor is connected to the bit line of a third metallization layer through a contact over the source/drain region, a third via over the contact, a continuous via-plug over the third via, and a fourth via over the continuous via-plug. The continuous via-plug penetrates the first and second metallization layers.

20 Claims, 17 Drawing Sheets

(56) References Cited

U.S. PATENT DOCUMENTS

| | | | |
|---|---|---|---|
| 9,704,564 B2 | 7/2017 | Liaw | |
| 9,865,542 B2 | 1/2018 | Liaw et al. | |
| 9,935,001 B2 | 4/2018 | Liaw | |
| 10,490,261 B2* | 11/2019 | Liaw | G11C 11/412 |
| 2004/0223359 A1* | 11/2004 | McClure | G11C 11/4125 365/154 |
| 2005/0253287 A1* | 11/2005 | Liaw | G11C 8/16 365/230.05 |
| 2006/0038234 A1* | 2/2006 | Liaw | G11C 8/16 257/368 |
| 2007/0001304 A1* | 1/2007 | Liaw | H01L 23/5226 257/758 |
| 2008/0025109 A1* | 1/2008 | Lee | G11C 11/412 365/189.05 |
| 2013/0163312 A1* | 6/2013 | Chang | G11C 11/413 365/156 |
| 2013/0258759 A1* | 10/2013 | Liaw | G06F 30/392 365/154 |
| 2014/0032871 A1* | 1/2014 | Hsu | G11C 11/419 711/167 |
| 2014/0153321 A1* | 6/2014 | Liaw | G11C 11/412 365/154 |
| 2018/0122812 A1* | 5/2018 | Liaw | H01L 23/528 |

* cited by examiner

SEMICONDUCTOR STRUCTURE

CROSS REFERENCE TO RELATED APPLICATIONS

This Application claims priority of U.S. Provisional Application No. 62/737,264, filed on Sep. 27, 2018, the entirety of which is incorporated by reference herein.

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

Memories are commonly used in ICs. For example, a static random access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

The semiconductor industry has experienced rapid growth due to continuous improvements in the integration density of a variety of electronic components (e.g., memory cells and standard cells). Therefore, metal routing efficiency is important for decreasing the complexity of IC designs.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
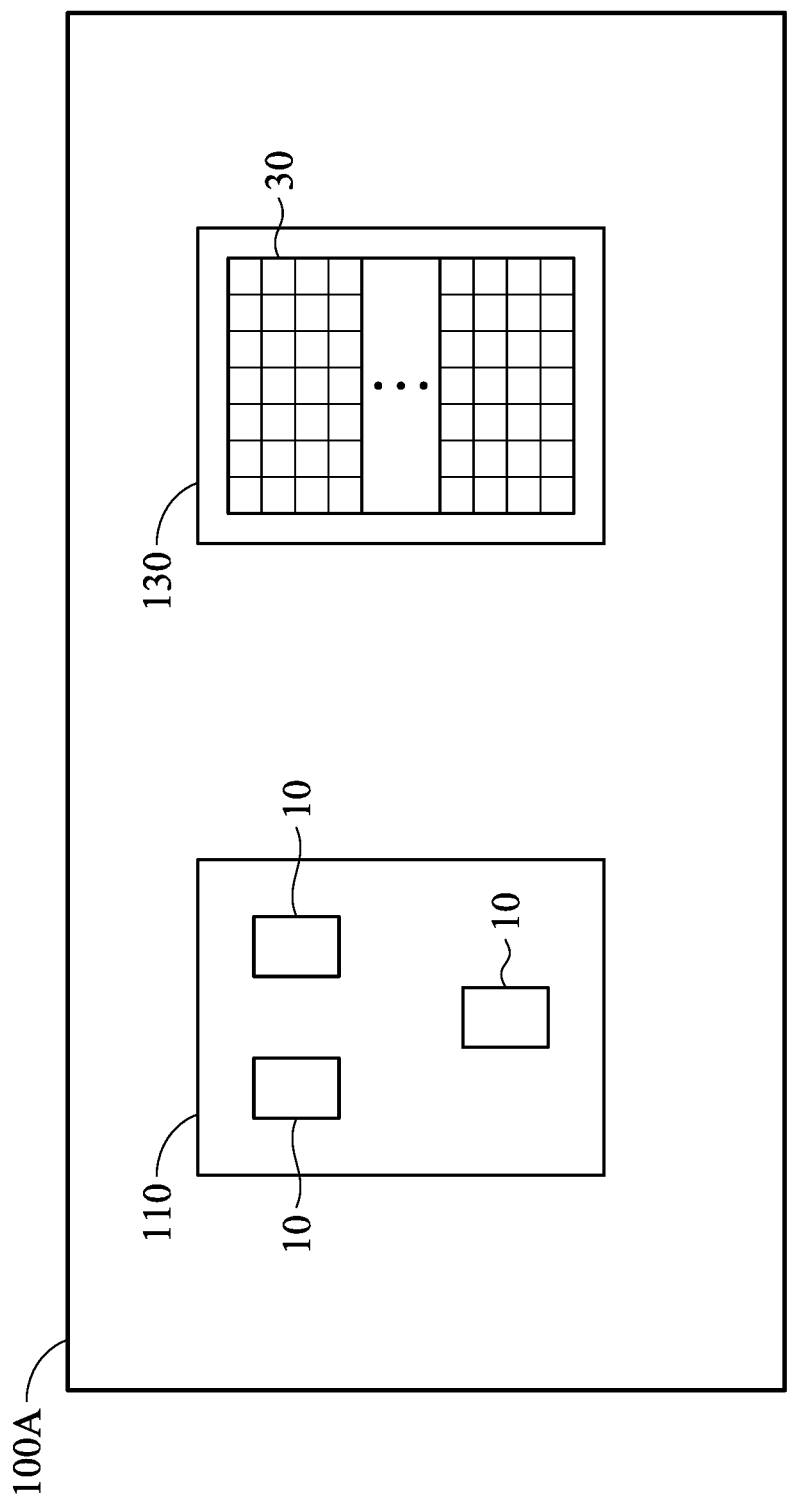
FIG. 1A is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1A is a simplified diagram of an IC 100A, in accordance with some embodiments of the disclosure. The IC 100A includes a first circuit 110 and a first memory 130. In some embodiments, the first circuit 110 may be the controller for accessing the first memory 130. The first circuit 110 includes multiple logic cells 10. In some embodiments, the first logic cell 10 may be a standard cell (STD cell). For example, the logic cells 10 may be the standard cells corresponding to the same logic gates (e.g., INV, NAND, NOR logic gate and so on) or different logic gates. The first memory 130 includes multiple memory cells 30 arranged in rows and columns of an array. In some embodiments, the memory cells 30 have the same circuit configuration and the same semiconductor structure. In some embodiments, the memory cell 30 may be a bit cell of SRAM or DRAM.

Figure 1B:
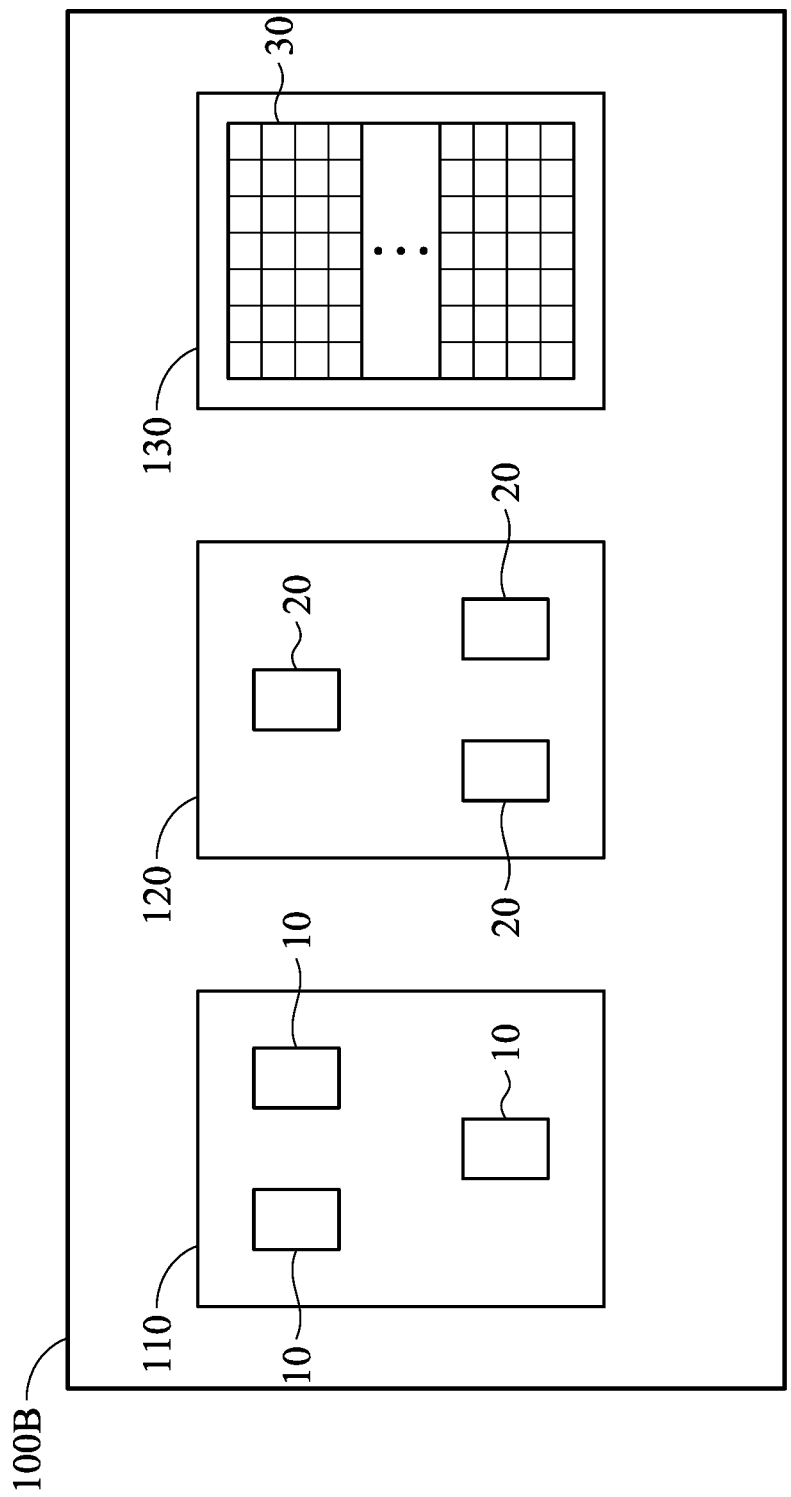
FIG. 1B is a simplified diagram of an IC, in accordance with some embodiments of the disclosure.

FIG. 1B is a simplified diagram of an IC 100B, in accordance with some embodiments of the disclosure. The IC 100B includes a first circuit 110, a second circuit 120 and a first memory 130. In some embodiments, the first circuit 110 and the second circuit 120 are configured to perform the same/similar functions or operations. For example, the first circuit 110 and the second circuit 120 may be the controllers for accessing the one or more first memories 130. In some embodiments, the first circuit 110 and the second circuit 120 are configured to perform the different functions or operations. As described above, the first circuit 110 includes multiple logic cells 10, and the logic functions of the logic cells 10 may be the same or different. Furthermore, the second circuit 120 includes multiple logic cells 20. In some embodiments, the second logic cell 20 may be a standard cell (STD cell). For example, the logic cells 20 may be the standard cells corresponding to the same logic gates (e.g., INV, NAND, NOR logic gate and so on) or different logic gates. Moreover, the first memory 130 includes multiple memory cells 30 arranged in rows and columns of an array. In some embodiments, the memory cells 30 have the same circuit configuration and the same semiconductor structure. Furthermore, the logic cells 10 and 20 corresponding to the same function or operation have the same circuit configuration with different semiconductor structures.

Figure 1C:
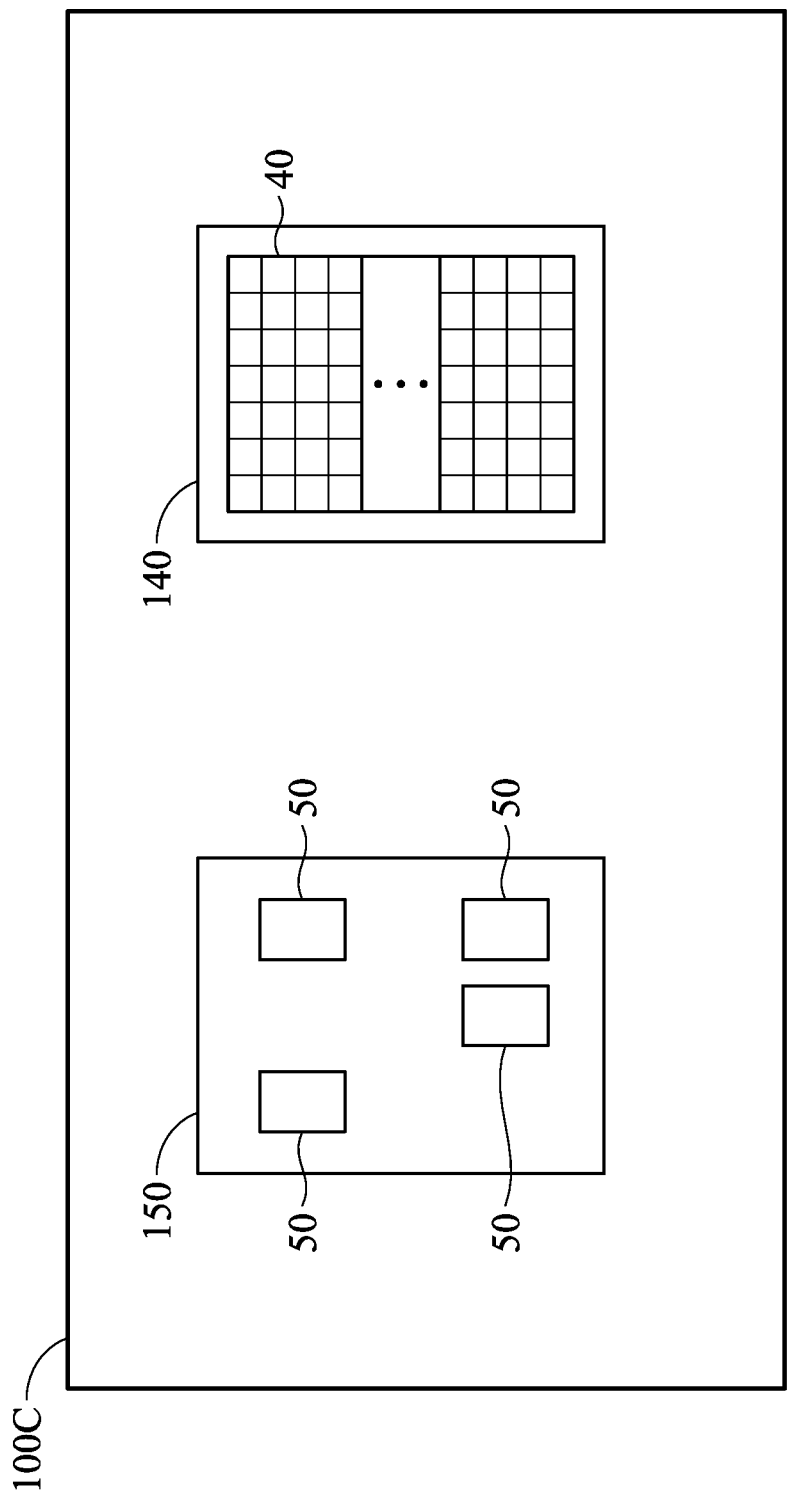
FIG. 1C is a simplified diagram of an IC, in accordance with some embodiments of the disclosure.

FIG. 1C is a simplified diagram of an IC 100C, in accordance with some embodiments of the disclosure. The IC 100C includes a third circuit 150 and a second memory 140. In some embodiments, the third circuit 150 may be the controller for accessing the second memory 140. The third circuit 150 includes multiple logic cells 50. The logic cell 50 may be a standard cell (STD cell). Furthermore, the logic cells that have the same function or operation as the logic cells 10 and 20, have the same circuit configuration, but different semiconductor structures. The second memory 140 includes multiple memory cells 40 arranged in rows and columns of an array. In some embodiments, the memory cells 40 have the same circuit configuration with the same semiconductor structure. In some embodiments, the memory cell 40 may be a bit cell of SRAM or DRAM.

In some embodiments, the memory cell 40 of the second memory 140 and the memory cell 30 of the first memory 130 have the same circuit configuration, but different semiconductor structures. In some embodiments, logic cells 10/20/50 and/or the memory cells 30/40 can be implemented in the same IC.

In some embodiments, the transistors in the IC 100A/100B/100C are selected from a group consisting of finFET structure, vertical gate all around (GAA), horizontal GAA, nano wire, nano sheet, and a combination thereof.

In some embodiments, the channel regions of the PMOS transistors in the IC 100A/100B/100C are SiGe content channel region.

Figure 2A:
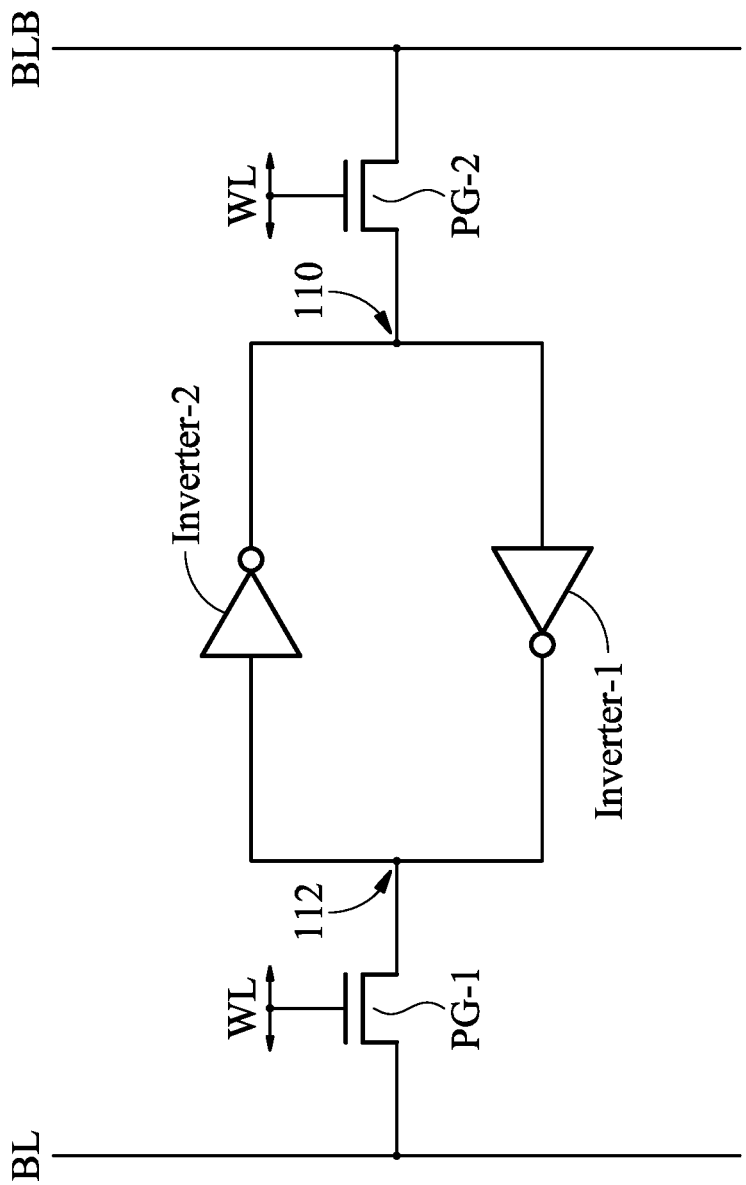
FIG. 2A illustrates a memory cell, in accordance with some embodiments of the disclosure.

FIG. 2A illustrates a memory cell 30, in accordance with some embodiments of the disclosure. In this embodiment, the memory cell 30 is a single-port SRAM bit cell. The memory cell 30 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL and the node 112, and the pass-gate transistor PG-2 is coupled between a complementary bit line BLB and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 2B:
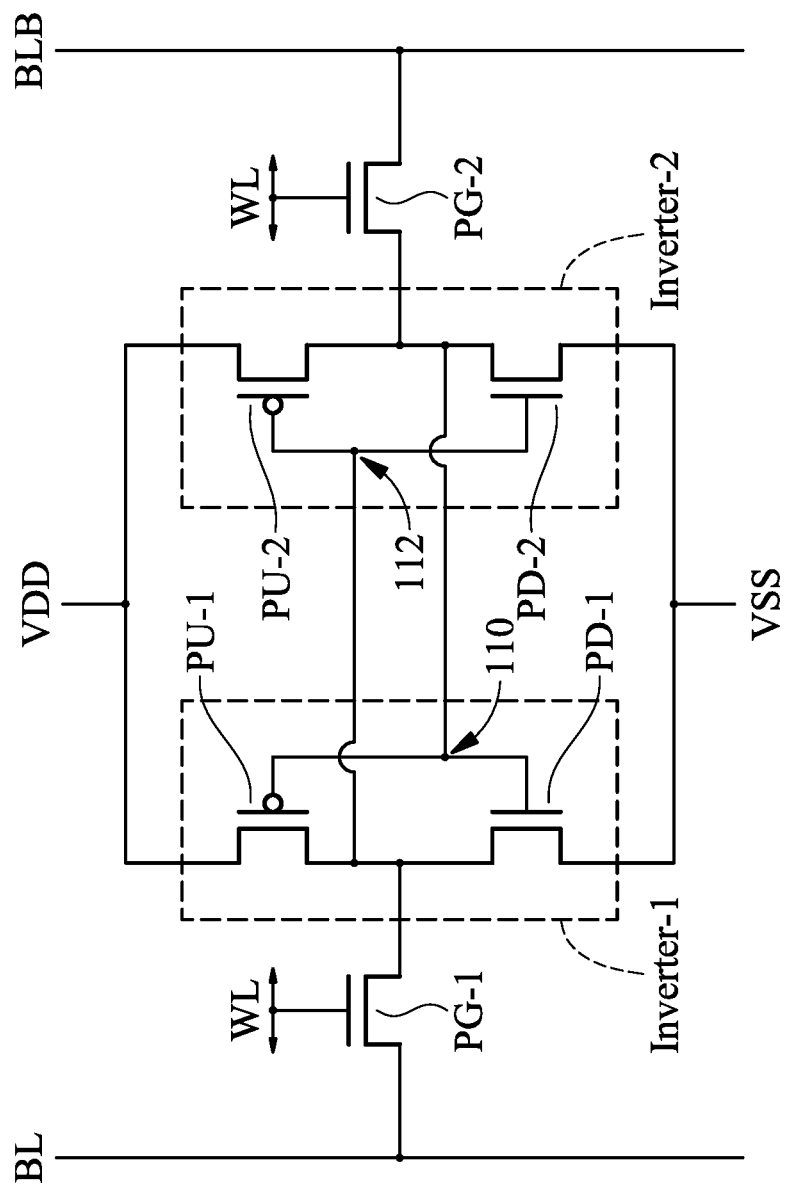
FIG. 2B shows a simplified diagram of the memory cell of FIG. 2A, in accordance with some embodiments of the disclosure.

FIG. 2B shows a simplified diagram of the memory cell 30 of FIG. 2A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the memory cell 30 are fin field effect transistors (FinFETs).

FIGS. 3A through 3E illustrate block diagrams of a layout of features of the memory cell 30, in accordance with some embodiments of the disclosure. FIGS. 3A through 3E illustrate features in different levels of the memory cell 30. In such embodiments, the memory cell 30 is a single-port SRAM bit cells of FIGS. 2A and 2B. Furthermore, an outer boundary of the memory cell 30 is illustrated using dashed lines.

Figure 3A:
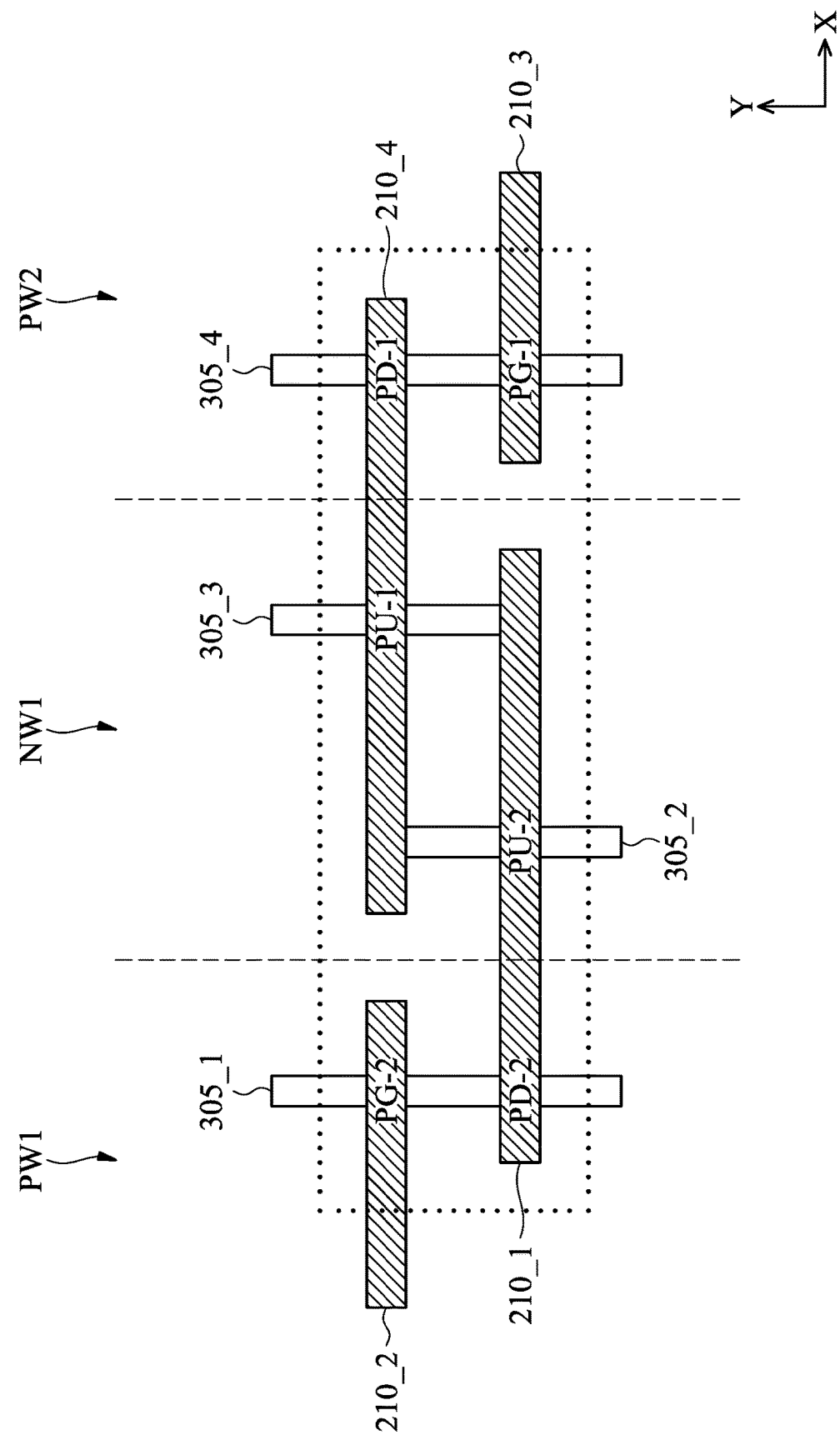
FIGS. 3A through 3E illustrate block diagrams of a layout of features of the memory cell, in accordance with some embodiments of the disclosure.

In FIG. 3A, an N-type well region NW1 is at the middle of memory cell 30, and two P-type well regions PW1 and PW2 are on opposite sides of N-type well region NW1. A gate electrode 210_1 forms the pull-up transistor PU-2 with an underlying active region 305_2 in the N-type well region NW1. In some embodiments, the active region 305_2 is fin-based and includes one or more fin structures disposed under the gate electrode 210_1 (e.g., the gate electrode 210_1 may be disposed over and extend along sidewalls of the active region 305_2). Furthermore, the active region 305_2 below the gate electrode 210_1 forms a channel region of the pull-up transistor PU-2. The gate electrode 210_1 further forms the pull-down transistor PD-2 with the underlying active region 305_1 in P-type well region PW1 (e.g., on the left side of N-type well region NW1). In other words, the gate electrode 210_1 is shared by the pull-up transistor PU-2 and the pull-down transistor PD-2. In some embodiments, the active region 305_1 is fin-based and includes one or more continuous fin structures disposed under the gate electrode 210_1 (e.g., the gate electrode 210_1 may be disposed over and extend along sidewalls of the active region 305_1). Furthermore, the active region 305_1 below the gate electrode 210_1 forms a channel region of the pull-down transistor PD-2.

The gate electrode 210_2 forms the pass-gate transistor PG-2 with the active region 305_1. In other words, the active region 305_1 is shared by the pass-gate transistor PG-2 and the pull-down transistor PD-2. In some embodiments, the gate electrode 210_2 is disposed over and extends along sidewalls of the active region 305_1. Furthermore, the active region 305_1 below the gate electrode 210_2 forms a channel region of the pass-gate transistor PG-2.

In FIG. 3A, the gate electrode 210_4 forms the pull-up transistor PU-1 with an underlying active region 305_3 in the N-type well region NW1. In some embodiments, the active region 305_3 is fin-based and includes one or more fin structures disposed under the gate electrode 210_4 (e.g., the gate electrode 210_4 may be disposed over and extend along sidewalls of the active region 305_3). Furthermore, the active region 305_3 below the gate electrode 210_4 forms a channel region of the pull-up transistor PU-1. The gate electrode 210_4 further forms the pull-down transistor PD-1 with an underlying active region 305_4 in the P-type well region PW2 (e.g., on the right side of the N-type well region NW1 opposing the P-type well region PW1). In other words, the gate electrode 210_4 is shared by the pull-up transistor PU-1 and the pull-down transistor PD-1. In some embodiments, the active region 305_4 is fin-based and includes one or more fin structures disposed under the gate electrode 210_4 (e.g., the gate electrode 210_4 may be disposed over and extend along sidewalls of the active region 305_4). Furthermore, the active region 305_4 below the gate electrode 210_4 forms a channel region of the pull-down transistor PD-1.

In FIG. 3A, the gate electrode 210_3 forms the pass-gate transistor PG-1 with the underlying active region 305_4. In other words, the active region 305_4 is shared by the pass-gate transistor PG-1 and the pull-down transistor PD-1. In some embodiments, the gate electrode 210_3 is disposed over and extends along sidewalls of the active region 305_4. Furthermore, the active region 305_4 below the gate electrode 210_3 forms a channel region of the pass-gate transistor PG-1.

In some embodiments, the gate electrodes 210_1 through 210_4 are parallel to the X-direction, and the active regions 305_1 through 305_4 are parallel to the Y-direction.

As described above, the pass-gate transistors PG-1 and PG-2, the pull-up transistors PU-1 and PU-2, and the pull-down transistors PD-1 and PD-2 are FinFETs, and the active regions 305_1 through 305_4 include one or more fin structures. The active regions 305_1 through 305_4 provide source/drains of various transistors on opposing sides of a respective gate electrode.

In FIG. 3A, each of the active regions 305_1 through 305_4 includes a single fin. In some embodiments, there may be a single fin, two fins, three fins, or more for the active regions 305_1 through 305_4. Furthermore, the number of fins in the active regions 305_1 through 305_4 may be the same or different as other active regions in the memory cell 30.

Figure 3B:
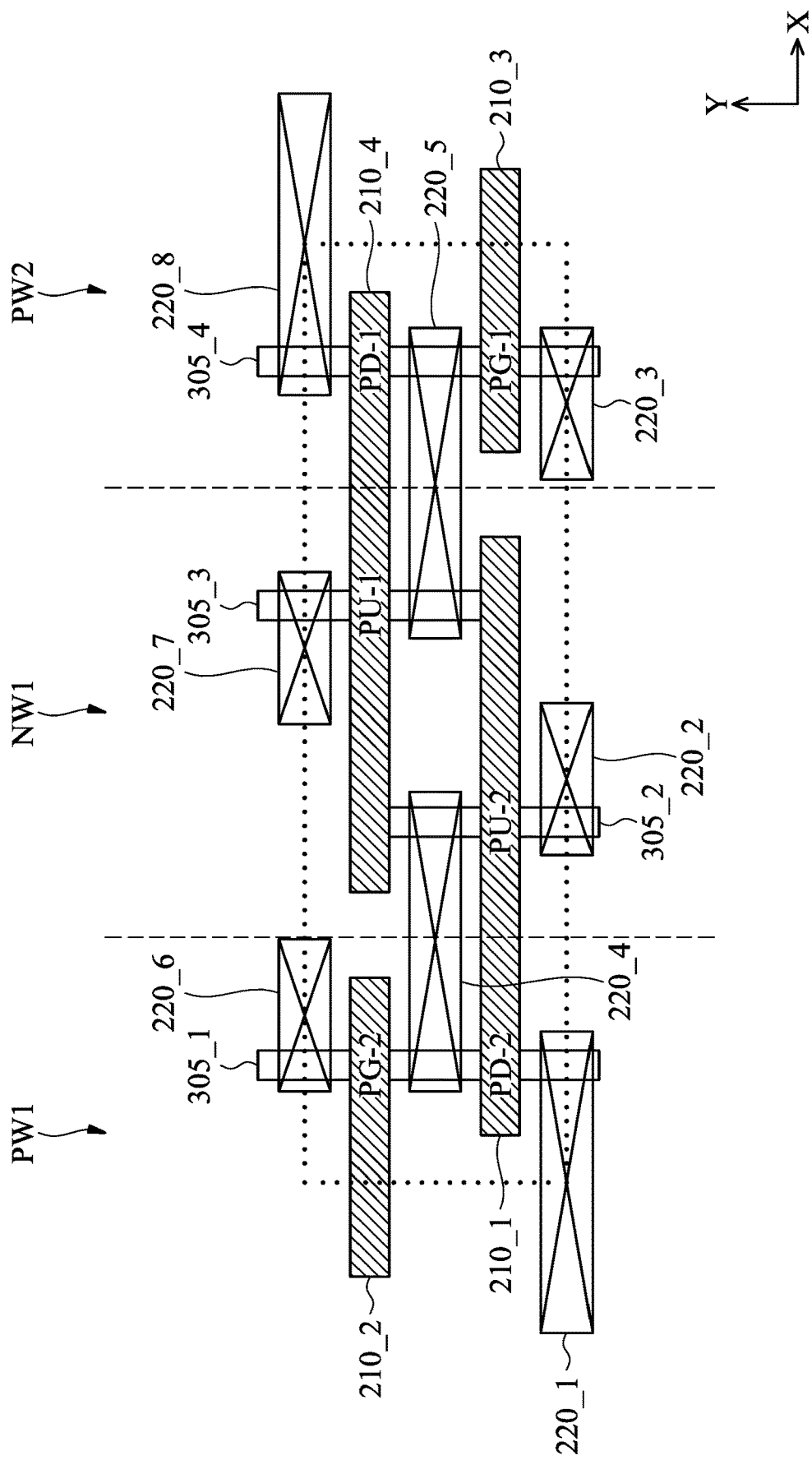

FIG. 3B shows features of the memory cell 30 in a contact level and lower. The contact level may include the source/drain contacts (also referred to as "contact") for connecting the source/drain regions of transistors (e.g., PG-1, PG-2, PD-1, PD-2, PU-1 and PU-2) to the overlying level. In some embodiments, the contact level may further include the gate contacts (also referred to as contact plugs) for connecting the gate electrodes of the transistors (e.g., PG-1, PG-2, PD-1, PD-2, PU-1 and PU-2) to an overlying level.

In FIG. 3B, each of the source/drain contacts 220_4 and 220_5 is a longer contact, and is elongated and has a longitudinal direction in the X-direction, which is parallel to the extending directions of the gate electrodes 210_1 through 210_4. Each of the source/drain contacts 220_4 and 220_5 has a rectangular shape which has a longer side along the X-direction and a shorter side along the Y-direction. Furthermore, the Y-direction is perpendicular to the X direction.

The source/drain contact 220_4 is used to connect the drain regions of the pull-down transistor PD-2 and the pull-up transistor PU-2 and the source/drain region of the pass-gate transistor PG-2. Furthermore, the source/drain contact 220_5 is used to connect the drain regions of the pull-down transistor PD-land the pull-up transistor PU-1 and the source/drain region of the pass-gate transistor PG-1.

The source/drain contacts 220_1 and 220_8 are used to connect to the source regions of the pull-down transistors PD-2 and PD-1 to the VSS lines (e.g., the electrical ground lines). The source/drain contacts 220_1 and 220_8 have lengthwise directions parallel to the X direction, and may be formed to overlap the corners (e.g., the upper right corner and the lower left corner of outer boundary formed by dashed lines) of the memory cell 30. Furthermore, the source/drain contacts 220_1 and 220_8 may further extend into neighboring memory cells 30 in a different column adjacent the memory cell 30. The source/drain contacts 220_1 and 220_8 may further be shared between two neighboring memory cells 30 in the adjacent rows.

Additionally, the source/drain contacts 220_2 and 220_7 are used to connect to the source regions of pull-up transistors PU-2 and PU-1 to the VDD lines (e.g., supply voltage lines). The source/drain contacts 220_2 and 220_7 may further be shared between two neighboring memory cells 30 in the adjacent rows.

The source/drain contacts 220_3 and 220_6 are used to connect to the source/drain regions of pass-gate transistors PG-1 and PG-2 to a bit line BL and a complementary bit line BLB, respectively. The source/drain contacts 220_3 and 220_6 may further be shared between two neighboring memory cells in the adjacent rows. Each of the source/drain contacts 220_3 and 220_6 has a rectangular shape which has a longer side along the X-direction and a shorter side along the Y-direction. In some embodiments, a dimension ratio of the longer side to the shorter side of the source/drain contacts 220_3 and 220_6 is greater than 1.2.

Figure 3C:
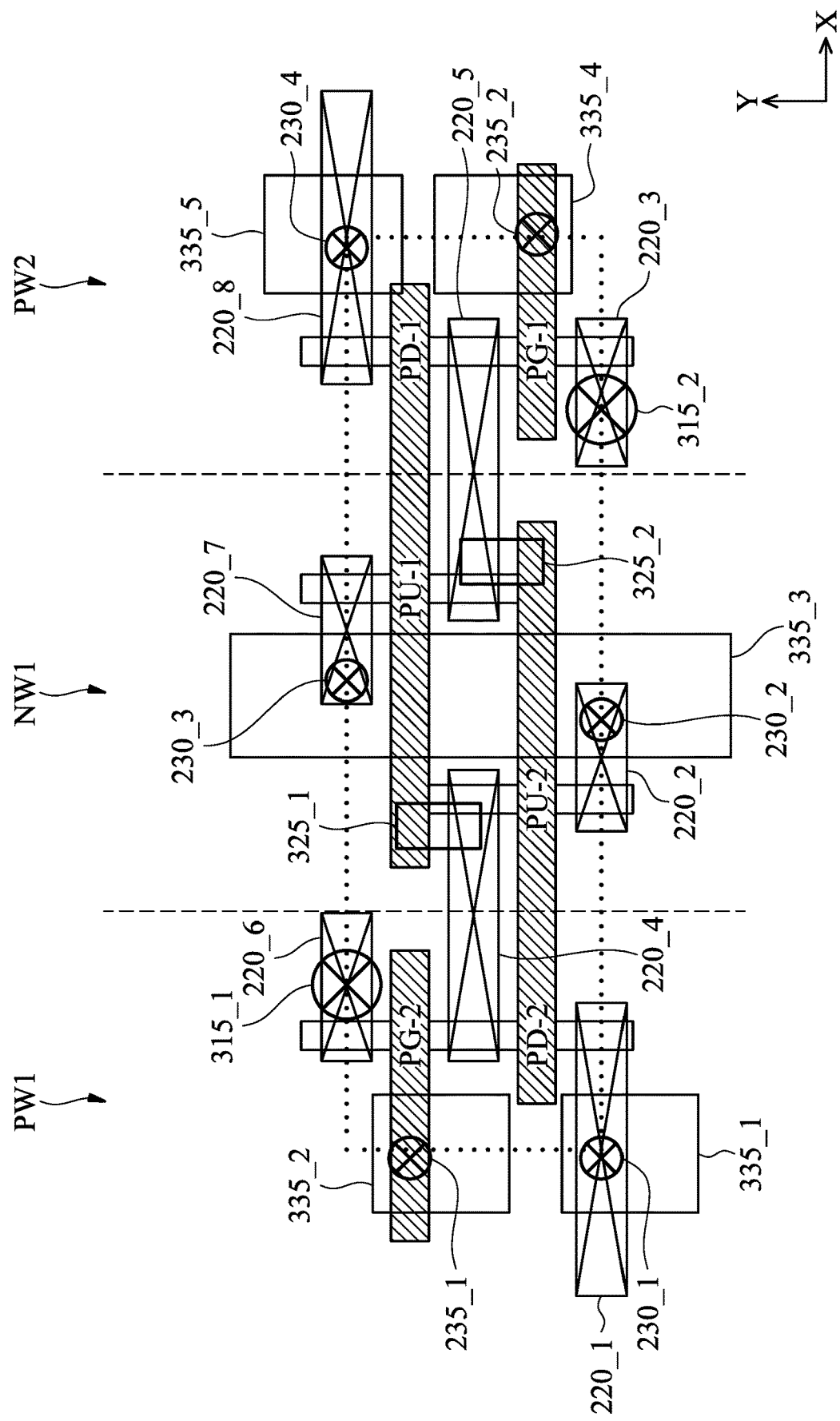

FIG. 3C shows features of the memory cell 30 in a metallization layer level M1 (not shown), a via level via_0 (not shown) and lower. The vias 230_1 through 230_4, the gate vias 235_1 and 235_2, the vias 315_1 and 315_2, and the vias 325_1 and 325_2 are disposed in the via level via_0. Furthermore, the conductive lines 335_1 through 335_5 are disposed in the metallization layer level M1 over the via level via_0. For example, various conductive lines in the metallization layer level M1 are disposed over various vias in the via level via_0. In some embodiments, the conductive lines 335_1 through 335_5 are parallel to the Y-direction.

The gate vias 235_1 and 235_2 are connected to the gate electrodes 210_2 and 210_3. The gate vias 235_1 and 235_2 are further connected to the conductive lines 335_2 and 335_4, which may be used to electrically couple gate electrodes of the pass gate transistors PG-2 and PG-1 to one or more word lines WL. Furthermore, the conductive lines 335_2 and 335_4 may further extend into and shared with neighboring memory cells in the adjacent columns.

Furthermore, the vias 230_1 and 230_4 are connected to the source/drain contacts 220_1 and 220_8 (e.g., the source contacts of the pull-down transistors PD-2 and PD-1), respectively. The vias 230_1 and 230_4 are further connected to the conductive lines 335_1 and 335_5, respectively, and the vias 230_1 and 230_4 may be used to electrically couple sources of the pull-down transistors PD-2 and PD-1 to the VSS lines. Furthermore, the vias 230_1 and 230_8 and the conductive lines 335_1 and 335_5 may further extend into neighboring memory cells in the adjacent columns, and may further be shared between two neighboring memory cells in different rows.

Additionally, the vias 230_2 and 230_3 are connected to the source/drain contacts 220_2 and 220_7 (e.g., the source contacts of the pull-up transistors PU-2 and PU-1). The vias 230_2 and 230_3 are further connected to the conductive line 335_3, which electrically connects the sources of the pull-up transistors PU-2 and PU-1 to the VDD line. The vias 230_2 and 230_3 may further be shared between two neighboring memory cells in different rows. In some embodiment, the conductive line 335_3 is shared by all memory cells in the same column.

The via 325_1 is a butt via, and includes a first portion over, and electrically connected to, the gate electrode 210_4, and a second portion over, and electrically connected to, the source/drain contact 220_4. Furthermore, the via 325_2 is a butt via, and includes a first portion over, and electrically connected to, the gate electrode 210_1, and a second portion over, and electrically connected to, the source/drain contact 220_5. In some embodiments, the vias 325_1 and 325_2 have a longitudinal direction in the Y-direction, which is perpendicular to the X-direction. In the manufacturing of the memory cell 30 on the semiconductor wafers, the vias 325_1 and 325_2 may be formed as a single continuous butt via.

In some embodiments, each of the vias 325_1 and 325_2 is a local-connection layer for connecting the corresponding gate electrode and the corresponding source/drain contact. In some embodiments, the vias 325_1 and 325_2 and the vias 230_1 through 230_4, and the gate vias 235_1 and 235_2 are coplanar. In some embodiments, the vias 325_1 and 325_2 and the vias 230_1 through 230_4, and the gate vias 235_1 and 235_2 are made of the same metal material.

In FIG. 3C, the vias 315_1 and 315_2 are connected to the source/drain contacts 220_6 and 220_3 (e.g., the sources of the pass-gate transistors PG-2 and PG-1), respectively. The vias 315_1 and 315_2 may be shared between two neighboring memory cells in different rows.

In some embodiments, the vias 230_1 through 230_4 have a circular shape with a first diameter, and the first diameter of the vias 230_1 through 230_4 is less than the width of the source/drain contacts 220_1, 220_2, 220_7 and 220_8. Furthermore, the vias 315_1 and 315_2 have a circular shape with a second diameter, and the second diameter of the vias 315_1 and 315_2 is greater than the width of the source/drain contacts 220_6 and 220_3. In some embodiments, the width of the source/drain contacts 220_1 through 220_8 are the same.

In some embodiments, the vias 315_1 and 315_2 have has a rectangular shape, and a dimension ratio of a longer side to a shorter side of the contact is greater than 1.2. Furthermore, the longer side of the vias 315_1 and 315_2 are parallel to the X-direction.

Figure 4:
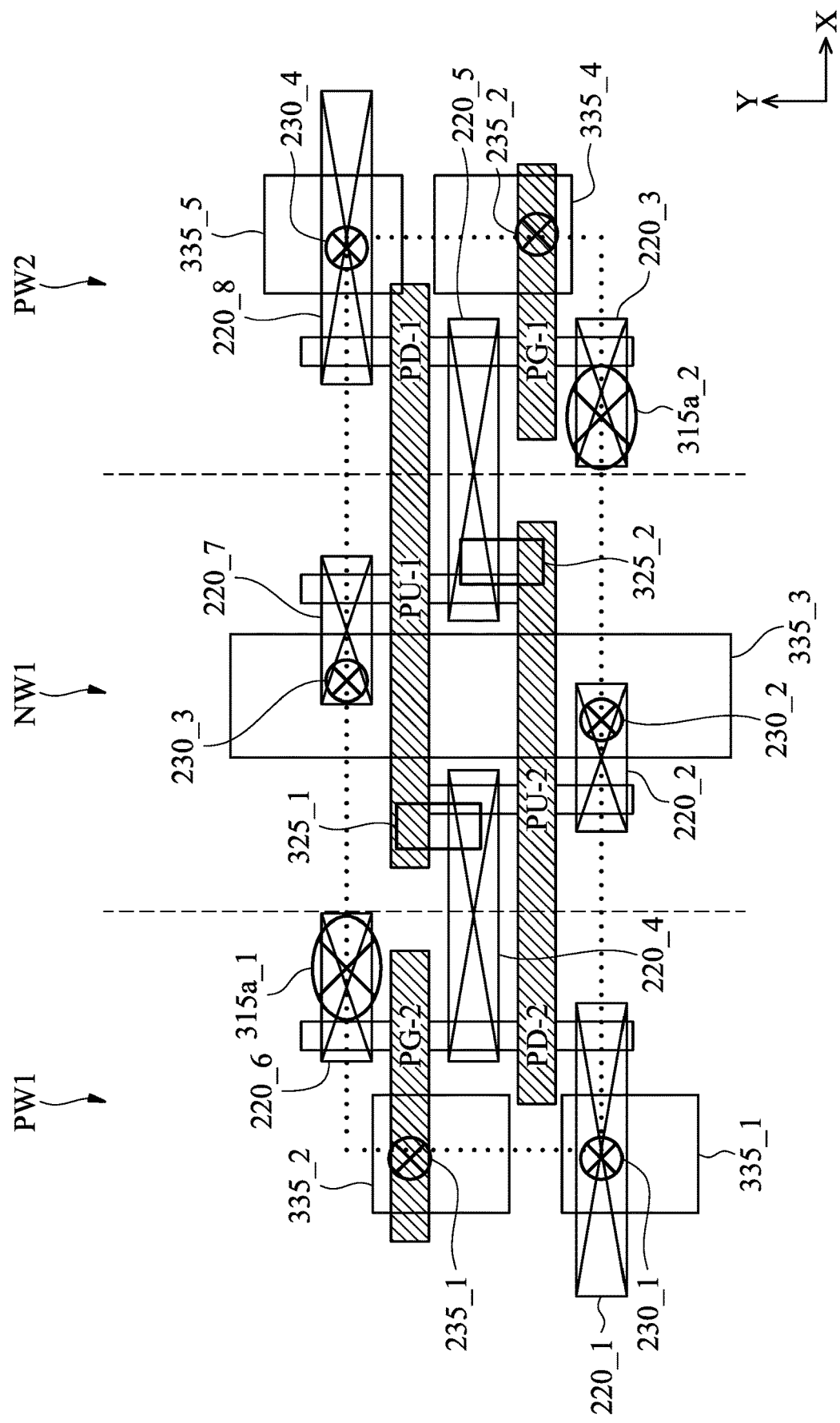
FIG. 4 shows features of the memory cell in a metallization layer level M1, a via level via_0 and lower, in accordance with some embodiments of the disclosure.

Referring to FIG. 4, FIG. 4 shows features of the memory cell 30 in a metallization layer level M1, a via level via_0 and lower, in accordance with some embodiments of the disclosure. Compared with the vias 315_1 and 315_2 of FIG. 3C, the vias 315a_1 and 315a_2 have an elliptical shape with a longer axis (e.g., a major axis) and a shorter axis (e.g., a minor axis). Furthermore, the shorter axis of the vias 315a_1 and 315a_2 is greater than the width of the source/drain contacts 220_6 and 220_3. In some embodiments, a dimension ratio of a longer axis to a shorter axis of the vias 315a_1 and 315a_2 is greater than 1.2.

Referring back to FIG. 3D, FIG. 3D shows features of the memory cell 30 in a metallization layer level M2 (not shown) and a via level via_1 (not shown) and lower. The vias 345_1 through 345_4 are disposed in the via level via_1, and the conductive lines 240_1 through 240_3 are disposed in the metallization layer level M2 over the via level via_1. For example, various conductive lines in the metallization layer level M2 are disposed over various vias in the via level via_1. In some embodiments, the conductive lines 240_1 through 240_3 are parallel to the X-direction.

Figure 3D:
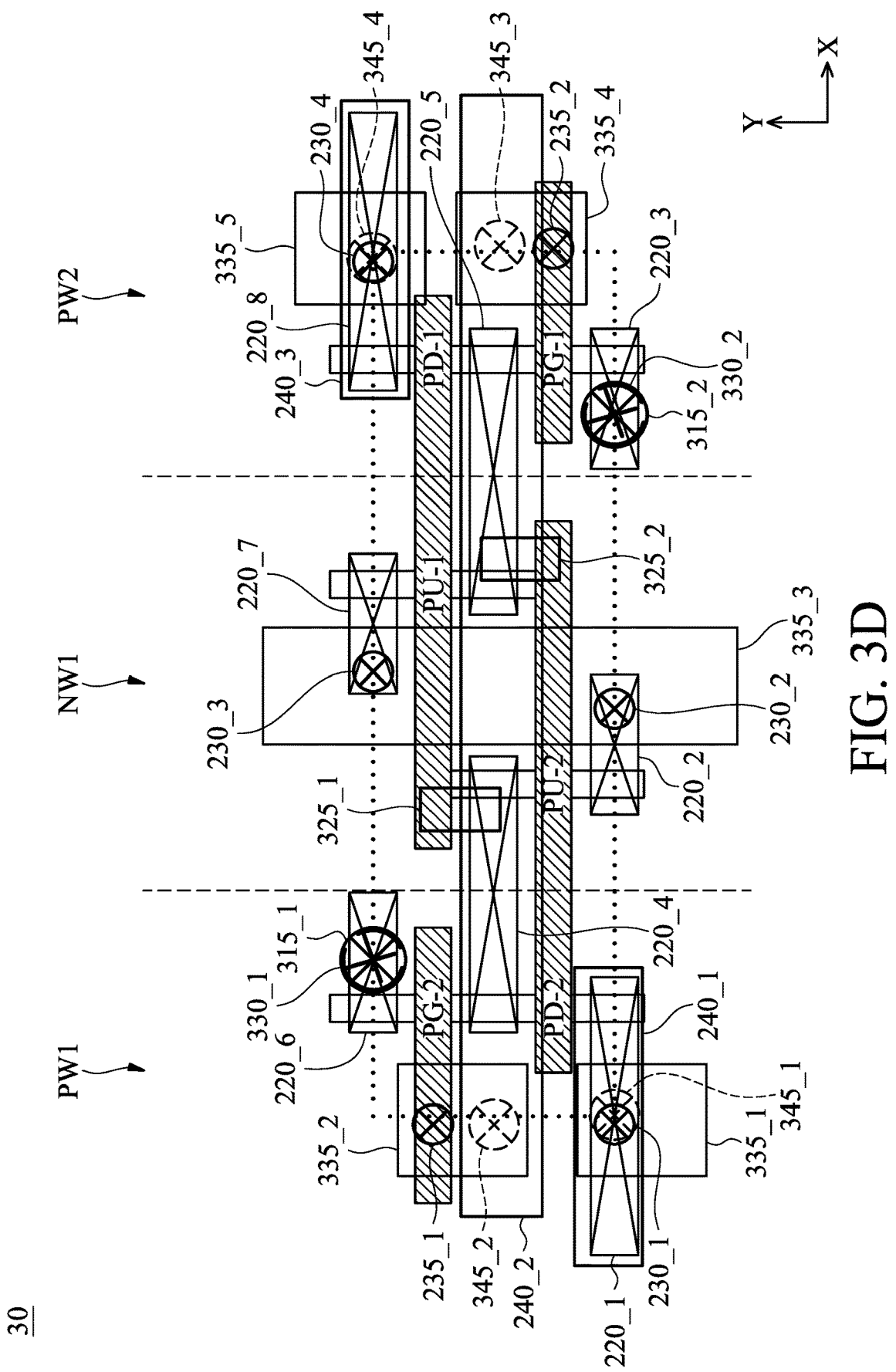

In FIG. 3D, the vias 345_2 and 345_3 are connected to the conductive line 240_2, which electrically connects the gate vias 235_1 and 235_2 (e.g., the gate vias for the pass-gate transistors PG-2 and PG-1) to a word line WL. In some embodiments, the memory cells 30 in the same row share the same word line WL, which is used to select or de-select memory cells 30. In some embodiments, the word line WL is further coupled to the upper layer over the conductive line 240_2.

The vias 345_1 and 345_4 are connected to the conductive lines 240_1 and 240_3, respectively, so as to electrically connect the source/drain contacts 220_1 and 220_8 (e.g., the source contacts for pull-down transistors PD-2 and PD-1) to the VSS line. The conductive lines 240_1 and 240_3 may further extend into and shared with the neighboring memory cells 30 in the different columns and/or rows.

The continuous via-plugs 330_1 and 330_2 are disposed in the metallization layer level M2, the via level via_1, and the metallization layer level M1. The continuous via-plug 330_1 is formed over the via 315_1, and connected to the contact 220_6 through the via 315_1. Furthermore, the continuous via-plug 330_2 is formed over the via 315_2, and connected to the contact 220_3 through the via 315_2. In other words, the continuous via-plugs 330_1 and 330_2 are directly landed on the vias 315_1 and 315_2 without the vias in the via level via_1, and the conductive lines in the metallization layer levels M1 and M2.

In some embodiments, the material of the continuous via-plugs 330_1 and 330_2 is selected from a group consisting of Ti, TiN, Pt, Co, Ru, W, TaN, Cu, and a combination thereof.

In some embodiments, the continuous via-plugs 330_1 and 330_2 have a circular shape with a diameter, and the diameter of the continuous via-plugs 330_1 and 330_2 is greater than the width of the source/drain contacts 220_6 and 220_3. In some embodiments, the continuous via-plugs 330_1 and 330_2 have a circular likes shape (e.g., an elliptical shape) with a longer axis and a shorter axis, and a dimension ratio of a longer axis to a shorter axis of the continuous via-plugs 330_1 and 330_2 is less than 1.2.

Figure 3E:
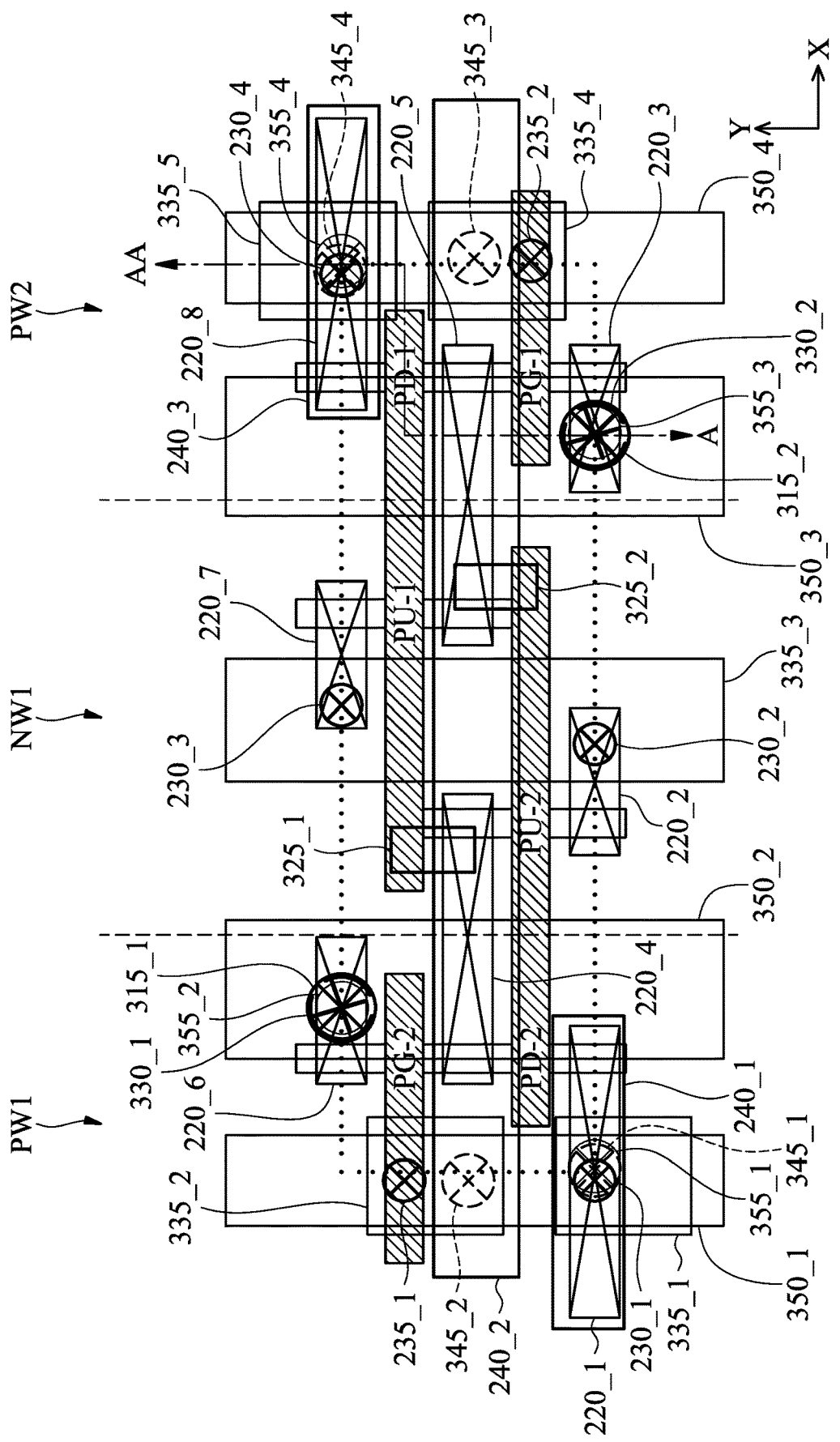

FIG. 3E shows features of the memory cell 30 in a metallization layer level M3 (not shown) and a via level via_2 (not shown) and lower. The vias 355_1 through 355_4 are disposed in the via level via_2, and the conductive lines 350_1 through 350_4 are disposed in the metallization layer level M3 over the via level via_2. For example, various conductive lines in the metallization layer level M3 are disposed over various vias in the via level via_2 or the continuous via-plugs 330_1 and 330_2. As described above, the continuous via-plug 330_1/330_2 penetrates the metallization layer level M1, the via level via_2 and the metallization layer level M2. In some embodiments, the conductive lines 350_1 through 350_4 are parallel to the Y-direction.

The vias 355_1 and 355_4 are connected to the conductive lines 350_1 and 350_4, respectively, so as to electrically connect the source/drain contacts 220_1 and 220_8 (e.g., the source contacts for pull-down transistors PD-2 and PD-1) to the VSS line. The conductive lines 350_1 and 350_4 may further extend into and shared with the neighboring memory cells 30 in the different columns and/or rows.

The vias 355_2 and 355_3 are connected to the continuous via-plugs 330_1 and 330_2, respectively. The vias 355_2 and 355_3 are further connected to the conductive lines 350_2 and 350_3, so as to electrically connect the sources of the pull-up transistors PG-2 and PG-1 to the complementary bit line BLB and the bit line BL, respectively. The vias 355_2 and 355_3 may be shared between two neighboring memory cells in different rows. Furthermore, the memory cells 30 in the same column share the bit line BL and the complementary bit line BLB in the array.

In some embodiments, the vias 355_1 through 355_4 have a circular shape with the same diameter, and the diameter of the vias 355_1 through 355_4 is less than the diameter of the continuous via-plugs 330_1 and 330_2.

Comparing with the conductive lines in the metallization layer level M1 functioned as the complementary bit line BLB and the bit line BL for bit-line capacitance reduction, by using the continuous via-plugs 330_1 and 330_2 to connect the conductive lines in the metallization layer level M3 that are functioned as the complementary bit line BLB and the bit line BL, the resistances of the complementary bit line BLB and the bit line BL are decreased in the memory cell 30. Therefore, when metal thickness and line width are continuous shrunk, no high resistance issue is caused in the memory cell 30, thereby no impacting the cell speed and voltage (e.g., V_min) performance for the memory cell 30. Furthermore, by using the continuous via-plugs 330_1 and 330_2 without the vias in the via level via_2 and the conductive lines (e.g., metal islands or landing pads) in the metallization layer levels M1 and M2, the capacitances of the complementary bit line BLB and the bit line BL are decreased in the memory cell 30 since no extra metal islands and vias will result higher bit line capacitance and degrade the cell speed. In other words, the memory array formed by the memory cells 30 has less IR drop in the bit line BL and complementary bit line BLB during the write cycle in the write margin. Furthermore, the memory array formed by the memory cells 30 also has low line resistance in the bit line BL and complementary bit line BLB for RC delay reduction. Thus, array efficiency and speed are increased in the memory array.

Figure 5:
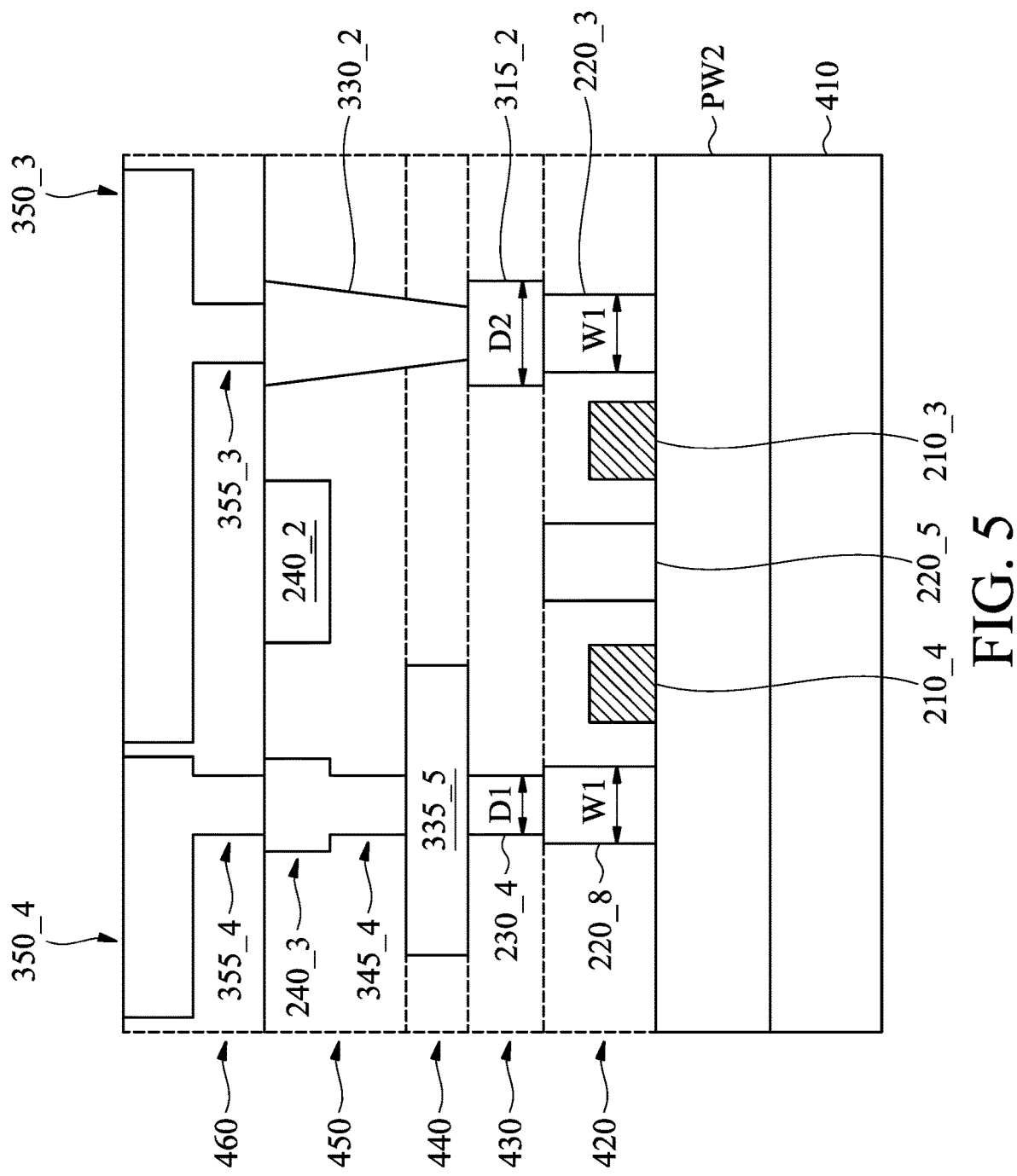
FIG. 5 illustrates a cross-sectional view of the semiconductor structure of the memory cell along line A-AA in FIG. 3E, in accordance with some embodiments of the disclosure.

Referring to FIG. 5, FIG. 5 illustrates a cross-sectional view of the semiconductor structure of the memory cell 30 along line A-AA in FIG. 3E, in accordance with some embodiments of the disclosure. The P-type well region PW2 is formed over a substrate 410. In some embodiments, the substrate 410 is a Si substrate. In some embodiments, the material of the substrate 410 is selected from a group consisting of bulk-Si, SiP, SiGe, SiC, SiPC, Ge, SOI—Si, SOI—SiGe, III-VI material, and a combination thereof.

The source/drain contacts 220_3, 220_5 and 220_8 and the gate electrodes 210_3 and 210_4 are positioned over the P-type well region PW2, and are formed in an Inter-Layer Dielectric (ILD) layer 420. The ILD layer 420 is formed over the P-type well region PW2. In some embodiments, the ILD 420 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

An inter-metallization dielectric (IMD) layer 430 is formed over the ILD layer 420. The vias 230_4 and 315_2 are disposed in the via level via_0 and formed in the IMD layer 430. The via 230_4 is electrically connected to the source/drain contact 220_8, and the via 315_2 is electrically connected to the source/drain contact 220_3.

In some embodiments, the width W1 of the source/drain contacts 220_8 and 220_3 are the same. As described above, a second diameter D2 of the via 315_2 is greater than the width W1 of the source/drain contact 220_3, e.g., D2>W1. Furthermore, the first diameter D1 of the via 230_4 is less than the width W1 of the source/drain contact 220_8, e.g., D1<W1.

An IMD layer 440 is formed over the IMD layer 430. The conductive line 335_5 is disposed in the metallization layer level M1 (not shown) and formed in the IMD layer 440. The conductive line 335_5 is electrically connected to the via 230_4. In some embodiments, the conductive line 335_5 is a metal line.

An IMD layer 450 is formed over the IMD layer 440. The conductive lines 240_2 and 240_3 are disposed in the metallization layer level M2 (not shown) and formed in the IMD layer 450. Furthermore, the via 345_4 is disposed in the via level via_2 (not shown) under the metallization layer level M2, and is formed in the IMD layer 450. The conductive line 240_3 is electrically connected to the conductive line 335_5 through the via 345_4. In some embodiments, the conductive lines 240_3 and 240_2 are metal lines.

The continuous via-plug 330_2 is formed in the IMD layers 440 and 450. In other words, the continuous via-plug 330_2 penetrates the metallization layer levels M1 and M2 and the via level via_2. Thus, the depth of the continuous via-plug 330_2 is equal to the sum of thickness of the metallization layer levels M1 and M2 and the via level via_2, e.g., the sum of thickness of the IMD layers 440 and 450. Since the depth of the continuous via-plug 330_2 is large, a landing pad having a large area is required for connecting the continuous via-plug 330_2. Thus, the via 315_2 has larger area/size than the via 230_4.

An IMD layer 460 is formed over the IMD layer 450. The conductive lines 350_4 and 350_3 are disposed in the metallization layer level M3 and formed in the IMD layer 460. Furthermore, the vias 355_4 and 355_3 are disposed in the via level via_2 under the metallization layer level M3, and are formed in the IMD layer 460. The conductive line 350_4 is electrically connected to the conductive line 240_3 through the via 355_4. Thus, the source/drain contact 220_8 is electrically connected to the conductive line 350_4 through the via 230_4, the conductive line 335_5, the via 345_4, the conductive line 240_3, and the via 355_4 in sequence. The conductive line 350_3 is electrically connected to the continuous via-plug 330_2 through the via 355_3. Thus, the source/drain contact 220_3 is electrically connected to the conductive line 350_3 through the via 315_2, the continuous via-plug 330_2 and the via 355_3 in sequence. In some embodiments, the conductive lines 350_4 and 350_3 are metal lines.

In some embodiments, the conductive lines 350_4 and 350_3 and the vias 355_4 and 355_3 are made of the same material. The conductive lines 240_3 and 240_2 and the via 345_4 are made of the same material. The conductive line 335_5 and the vias 230_4 and 315_2 are made of different materials.

In some embodiments, the conductive lines 350_4 and 350_3 and the vias 355_4 and 355_3 are formed in a dual damascene process. The conductive lines 240_3 and 240_2 and the via 345_4 are formed in a dual damascene process. The conductive line 335_5 and the vias 230_4 and 315_2 are formed in a single damascene process.

In some embodiments, the vias 230_4 and 315_2 and the continuous via-plug 330_2 are made of a metal material, such as a single tungsten (W) plug. In some embodiments, the vias 230_4 and 315_2 and the continuous via-plug 330_2 are made of a metal material without a barrier metal layer. In some embodiments, the vias 230_4 and 315_2 and the continuous via-plug 330_2 are made of a metal material without Copper, and the metal material can provide better trench/via gap filling and batter metal resistivity. Thus, no barrier metal layers will impact the Copper metal trench filling capability and therefore result metal resistance degradation or even worse have via opening and EM concern.

As described above, the second diameter D2 of the via 315_2 is greater than the width W1 of the source/drain contact 220_3, e.g., D2>W1. In some embodiments, the via 315_1 projected range in vertical direction is partially overlay the gate electrode 210_3 and isolated by a gate top dielectric layer (not shown). The material of the gate top dielectric layer may be formed by a single layer or multiple layers stacked and selected from a group consist of SiO2, SiOC, SiON, SiOCN, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and a combination thereof.

Figure 6:
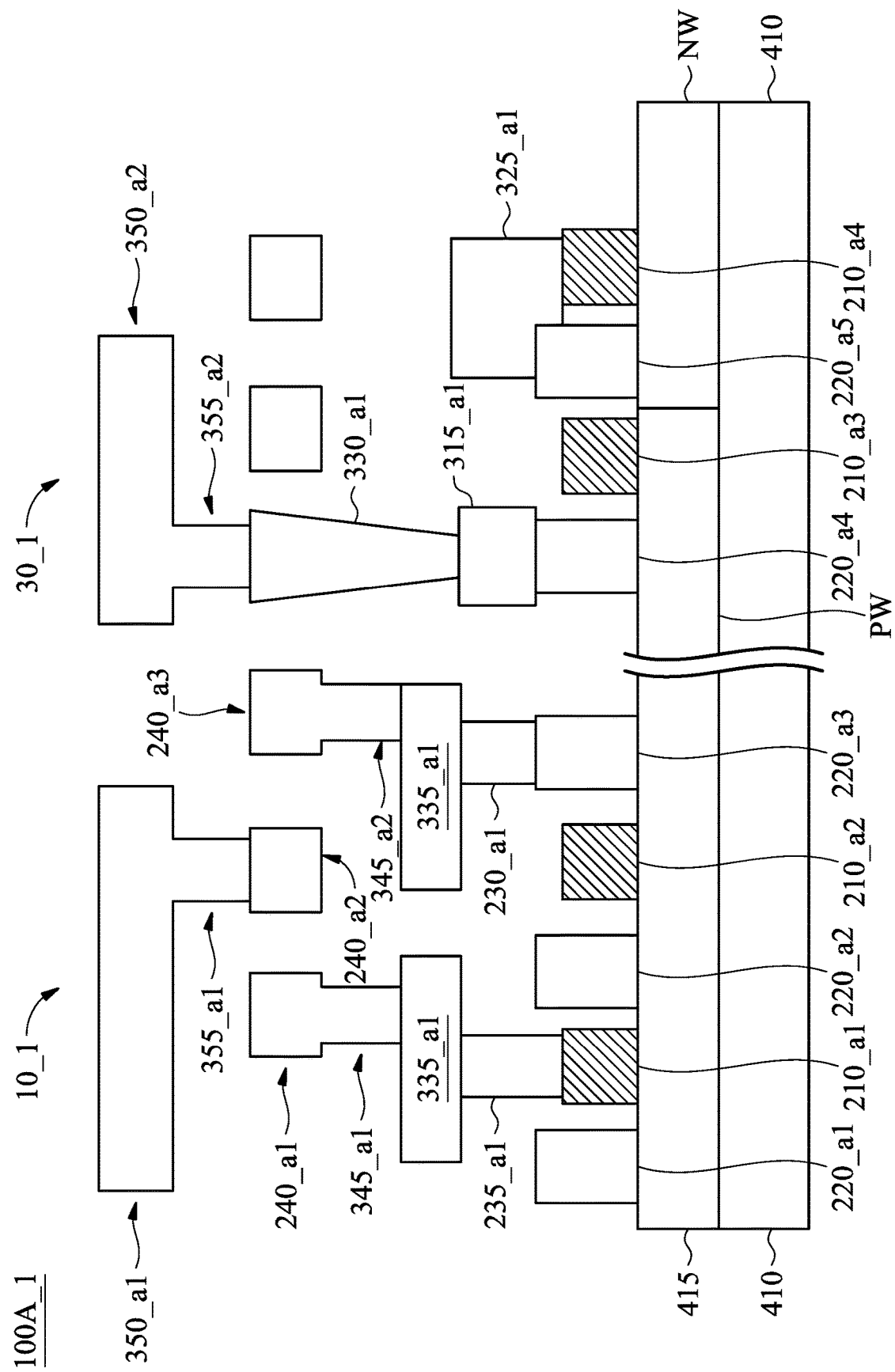
FIG. 6 illustrates a cross-sectional view of the semiconductor structure of an IC, in accordance with some embodiments of the disclosure.

FIG. 6 illustrates a cross-sectional view of the semiconductor structure of an IC 100A_1, in accordance with some embodiments of the disclosure. The IC 100A_1 includes multiple logic cells 10_1 formed a first circuit (e.g., 110 of FIG. 1A) and multiple memory cells 30_1 formed a first memory (e.g., 130 of FIG. 1A).

In the memory cell 30_1, a P-type well region PW and an N-type well region NW is formed over a substrate 410. The source/drain contact 220_a4 and the gate electrode 210_a3 are positioned over the P-type well region PW, and the source/drain contact 220_a5 and the gate electrode 210_a4 are positioned over the N-type well region NW.

In the memory cell 30_1, the gate electrode 210_a4 is electrically connected to the source/drain contact 220_a5 through the via 325_a1 of the via level via_0. In some embodiments, the via 325_a1 is a butt via, and includes a first portion over, and electrically connected to, the gate electrode 210_a4, and a second portion over, and electrically connected to, the source/drain contact 220_a5. In other words, the via 325_a1 is a local-connection layer for connecting the gate electrode 210_a4 and the source/drain contact 220_a5. In some embodiments, the via 325_a1, the gate via 235_a1, the via 230_a1 and the via 315_a1 are coplanar, and are made of the same metal material. In some embodiments, the via 325_a1 is used to connect the gate regions of the pull-up transistor PU-1 and the pull-down transistor PD-1 to the drain regions of the pull-up transistor PU-2 and the pull-down transistor PD-2 in the memory cell 30_1. In some embodiments, the via 325_a1 is used to connect the gate regions of the pull-up transistor PU-2 and the pull-down transistor PD-2 to the drain regions of the pull-up transistor PU-1 and the pull-down transistor PD-1 in the memory cell 30_1.

In the memory cell 30_1, the source/drain contact 220_a4 is electrically connected to the conductive line 350_a2 of the metallization layer level M3 through the via 315_a1 of the via level via_0, the continuous via-plug 330_a1, and the via 355_a2 of the via level via_2 in sequence. In some embodiments, the conductive line 350_a2 and the via 355_a2 are made of the same material. Furthermore, the contact 220_a4 is used to connect the source region of the pass-gate transistor PG-1/PG-2 in the memory cell 30_1. Therefore, the bit line BL or the complementary bit line BLB is connected to the source region of the pass-gate transistor PG-1/PG-2 through the source/drain contact 220_a4, the via 315_a1, the continuous via-plug 330_a1, the via 355_a2, and the conductive line 350_a2.

In the logic cell 10_1, a well region 415 is formed over the substrate 410. The source/drain contacts 220_a1 through 220_a3 and the gate electrodes 210_a1 and 210_a2 are positioned over the well region 415. In some embodiments, the well region 415 is a P-type well region, and the gate electrodes 210_a1 and 210_a2 are coupled to the gate regions of NMOS transistors in the logic cell 10_1. Furthermore, the contacts 220_a1 through 220_a3 are coupled to the source/drain regions of NMOS transistors in the logic cell 10_1. In some embodiments, the well region 415 is an N-type well region, and the gate electrodes 210_a1 and 210_a2 are coupled to the gate regions of PMOS transistors in the logic cell 10_1. Furthermore, the contacts 220_a1 through 220_a3 are coupled to the source/drain regions of PMOS transistors in the logic cell 10_1.

In the logic cell 10_1, the gate electrode 210_a1 is electrically connected to the conductive line 240_a1 of the metallization layer level M2 through the gate via 235_a1 of the via level via_0, the conductive line 335_a1 of the metallization layer level M1, and the via 345_a1 of the via level via_1 in sequence. In some embodiments, the conductive line 240_a1 and the via 345_a1 are made of the same material, and the conductive line 335_a1 and the gate via 235_a1 are made of different materials.

In the logic cell 10_1, the source/drain contact 220_a3 is coupled to the source region or the drain region of the transistor corresponding to the gate electrode 210_a2, and is electrically connected to the conductive line 240_a3 of the metallization layer level M2 through the via 230_a1 of the via level via_0, the conductive line 335_a2 of the metallization layer level M1, and the via 345_a2 of the via level via_1 in sequence. In some embodiments, the conductive line 240_a3 and the via 345_a2 are made of the same material, and the conductive line 335_a2 and the via 230_a1 are made of different materials.

In the logic cell 10_1, the conductive line 240_a2 of the metallization layer level M2 is electrically connected to the conductive line 350_a1 of the metallization layer level M3 through the via 355_a1 of the via level via_2. In some embodiments, the conductive line 350_a1 and the via 355_a1 are made of the same material.

In the IC 100A_1 of FIG. 6, the conductive line 350_a2 capable of connecting the bit line BL or the complementary bit line BLB of the memory cell 30_1 is arranged in the metallization layer level M3, and the continuous via-plug 330_a1 is used to replace the multiple stacked connection (e.g., the via of the via level via_1 and the via levels M1 and M2), thereby bit-line capacitance of the memory cell 30_1 is decreased.

In the IC 100A_1 of FIG. 6, compared with the memory cell 30_1, no continuous via-plug is used to connect the conductive line of the metallization layer level M3 to the via of the via level via_0 in the logic cell 10_1.

Figure 7:
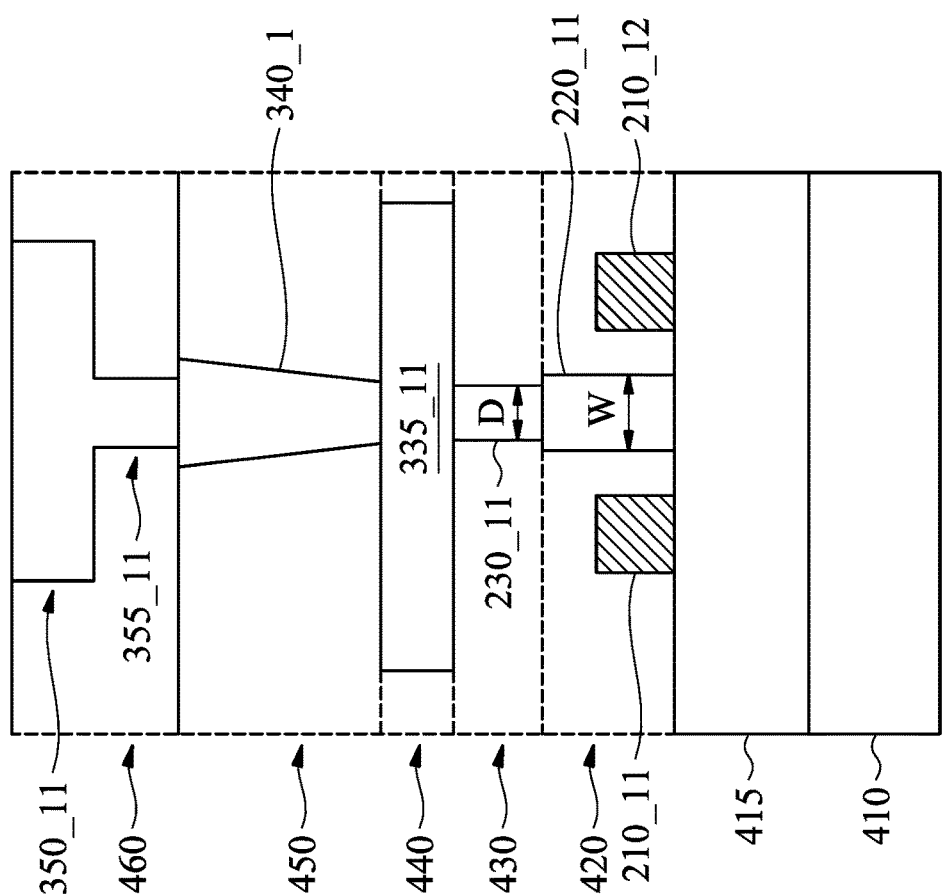
FIG. 7 illustrates a cross-sectional view of the semiconductor structure of the logic cell, in accordance with some embodiments of the disclosure.

FIG. 7 illustrates a cross-sectional view of the semiconductor structure of the logic cell 20, in accordance with some embodiments of the disclosure. The well region 415 is formed over a substrate 410. The source/drain contact 220_11 and the gate electrodes 210_11 and 210_12 are positioned over the well region 415, and are formed in the ILD layer 420. In some embodiments, the well region 415 is a P-type well region, and the gate electrodes 210_11 and 210_12 are coupled to the gate regions of NMOS transistors in the logic cell 20. Furthermore, the contact 220_11 is coupled to the source/drain region of NMOS transistor in the logic cell 20. In some embodiments, the well region 415 is an N-type well region, and the gate electrodes 210_11 and 210_12 are coupled to the gate regions of PMOS transistors in the logic cell 20. Moreover, the contact 220_11 is coupled to the source/drain region of PMOS transistor in the logic cell 20.

The via 230_11 is disposed in the via level via_0 and formed in the IMD layer 430. The via 230_11 is electrically connected to the source/drain contact 220_11. In some embodiments, the width W of the source/drain contact is greater than or equal to the diameter D of the via 230_11.

The conductive line 335_11 is disposed in the metallization layer level M1 and formed in the IMD layer 440. The conductive line 335_11 is electrically connected to the via 230_11. In some embodiments, the conductive line 335_5 is a metal line.

The continuous via-plug 340_1 is formed in the IMD layer 450. In other words, the continuous via-plug 340_1 penetrates the metallization layer level M2 and the via level via_1. Thus, the depth of the continuous via-plug 340_1 is equal to the sum of thickness of the metallization layer level M2 and the via level via_1, e.g., the thickness of the ILD 450. Since the depth of the continuous via-plug 340_1 is large, a landing pad having a large area is required for connecting the continuous via-plug 340_1. Thus, the conductive line 335_11 has larger area/size.

The conductive line 350_11 is disposed in the metallization layer level M3 and formed in the IMD layer 460. Furthermore, the via 355_11 is disposed in the via level via_2 and formed in the IMD layer 460. The conductive line 350_11 is electrically connected to the continuous via-plug 340_1 through the via 355_11. Thus, the source/drain contact 220_11 is electrically connected to the conductive line 350_11 through the via 230_11, the conductive line 335_11, the continuous via-plug 340_1, and the via 355_11 in sequence.

In some embodiments, the conductive line 350_11 and the via 355_11 are made of the same material, and the conductive line 335_11 and the via 230_11 are made of different materials. In some embodiments, the conductive line 350_11 and the via 355_11 are formed in a dual damascene process, and the conductive line 335_11 and the via 230_11 are formed in a single damascene process. In some embodiments, the via 230_11 and the continuous via-plug 340_1 are made of a metal material, such as a single tungsten (W) plug. In some embodiments, the via 230_11 and the continuous via-plug 340_1 are made of a metal material without a barrier metal layer.

In the logic cell 20, the continuous via-plug 340_1 is used to replace the multiple stacked connection (e.g., the via of the via level via_1 and the via level M2), thereby routing density is improved.

Figure 8:
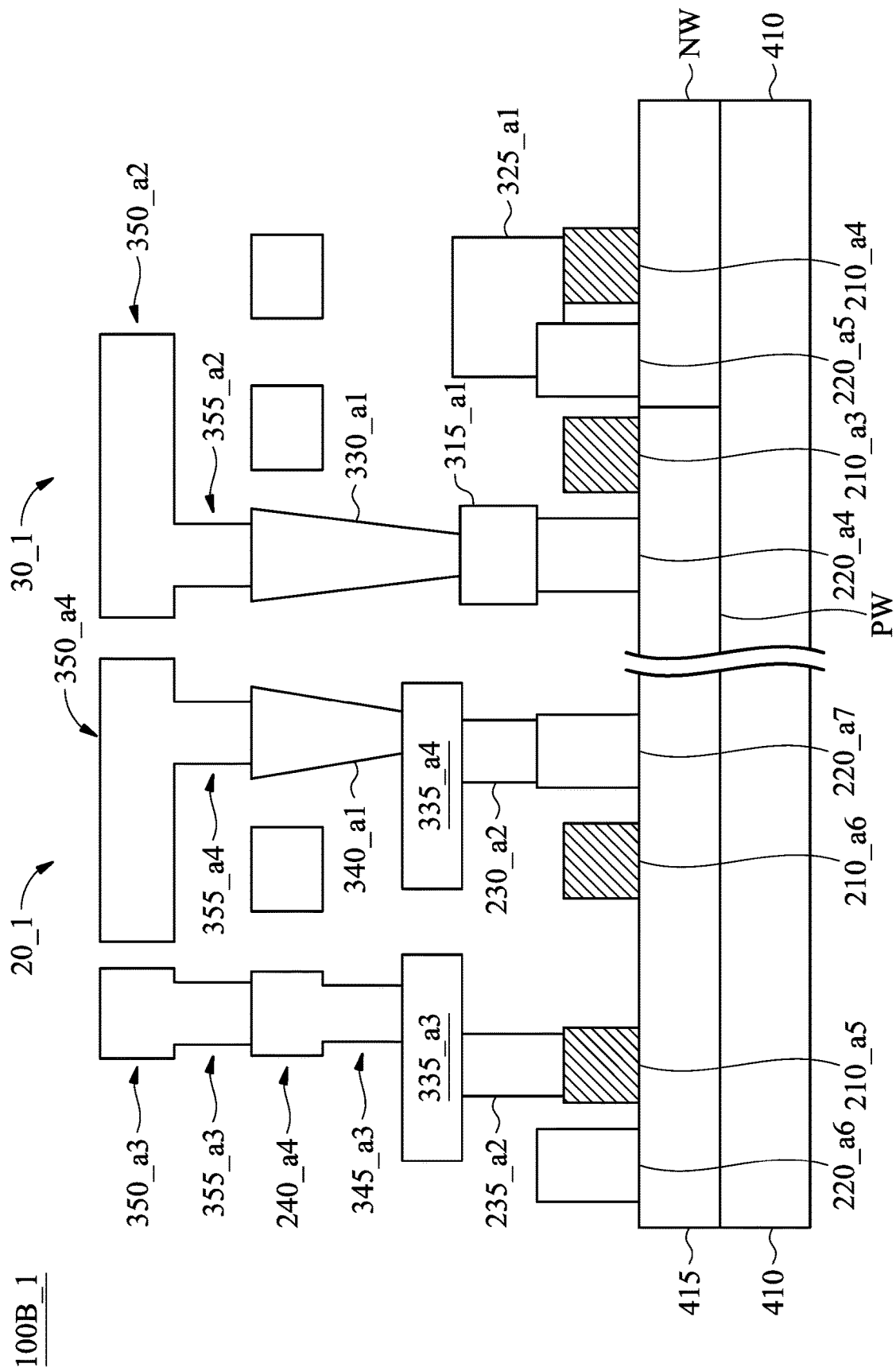
FIG. 8 illustrates a cross-sectional view of the semiconductor structure of an IC, in accordance with some embodiments of the disclosure.

FIG. 8 illustrates a cross-sectional view of the semiconductor structure of an IC 100B_1, in accordance with some embodiments of the disclosure. The IC 100B_1 includes multiple logic cells 10_1 (not shown) formed a second circuit (e.g., 110 of FIG. 1B), multiple logic cells 20_1 formed a second circuit (e.g., 120 of FIG. 1B) and multiple memory cells 30_1 formed a first memory (e.g., 130 of FIG. 1B). The memory cell 30_1 has been described in FIG. 6 and will be omitted. Furthermore, in order to simplify the description, the logic cell 10_1 is omitted in FIG. 8.

In the logic cell 20_1, a well region 415 is formed over the substrate 410. The source/drain contact 220_a6 and the gate electrode 210_a5 are positioned over the well region 415. In some embodiments, the well region 415 is a P-type well region, and the gate electrodes 210_a5 and 210_a6 are coupled to the gate regions of NMOS transistors in the logic cell 20_1. Furthermore, the contacts 220_a6 and 220_a7 are coupled to the source/drain regions of NMOS transistors in the logic cell 20_1. In some embodiments, the well region 415 is an N-type well region, and the gate electrodes 210_a5 and 210_a6 are coupled to the gate region of PMOS transistor in the logic cell 20_1. Furthermore, the contacts 220_a6 and 220_a7 are coupled to the source/drain regions of PMOS transistors in the logic cell 20_1.

In the logic cell 20_1, the gate electrode 210_a5 is electrically connected to the conductive line 350_a3 of the metallization layer level M3 through the gate via 235_a2 of the via level via_0, the conductive line 335_a3 of the metallization layer level M1, the via 345_a3 of the via level via_1, the conductive line 240_a4 of the metallization layer level M2, and the via 355_a3 of the via level via_2 in sequence. In some embodiments, the conductive line 350_a3 and the via 355_a3 are made of the same material, the conductive line 240_a4 and the via 345_a3 are made of the same material, and the conductive line 335_a3 and the gate via 235_a2 are made of different materials.

In the logic cell 20_1, the contact 220_a7 is electrically connected to the conductive line 350_a4 of the metallization layer M3 through the via 230_a2 of the via level via_0, the conductive line 335_a4 of the metallization layer level M1, the continuous via-plug 340_a1, and the via 355_a4 of the via level via_2 in sequence. In some embodiments, the conductive line 350_a4 and the via 355_a4 are made of the same material, and the conductive line 335_a4 and the gate via 230_a2 are made of different materials.

In some embodiments, the well region 415 is a P-type well region, and the source/drain contact 220_a7 is coupled to the source region of NMOS transistor for connecting a VSS line to the source region of NMOS transistor. In some embodiments, the well region 415 is an N-type well region, and the source/drain contact 220_a7 is coupled to the source region of PMOS transistor for connecting a VDD line to the source region of PMOS transistor.

In the IC 100B_1, the depth of the continuous via-plug 330_a1 in the memory cell 30_1 is greater than the depth of the continuous via-plug 340_a1 in the cell 20_1. In some embodiments, the via 230_a2 and the continuous via-plug 340_a1 are made of a metal material, such as a single tungsten (W) plug. In some embodiments, the via 230_a2 and the continuous via-plug 340_a1 are made of a metal material without a barrier metal layer. In some embodiments, the conductive line 240_a4 and the via 345_a3 include the Cu-based material or the Co-based material, and the continuous via-plug 340_a1 includes the W-based material.

Figure 9:
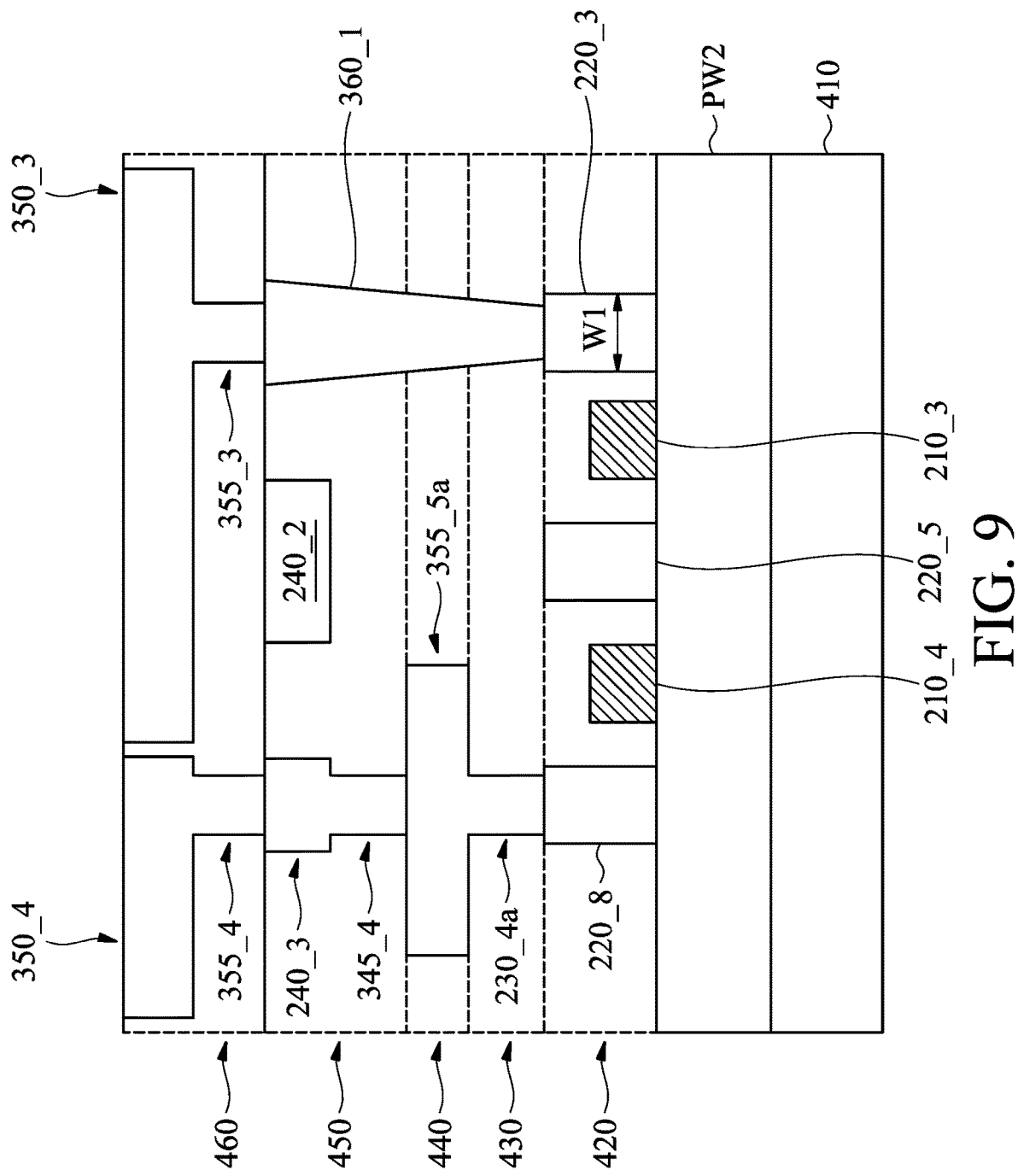
FIG. 9 illustrates a cross-sectional view of the semiconductor structure of the memory cell, in accordance with some embodiments of the disclosure.

FIG. 9 illustrates a cross-sectional view of the semiconductor structure of the memory cell 40, in accordance with some embodiments of the disclosure. As described above, the memory cell 40 and the memory cell 30 have the same circuit configuration, as shown in FIGS. 2A and 2B, but different semiconductor structures.

Referring to FIG. 5 and FIG. 9 together, the conductive line 335_5 and the via 230_4 are made of different materials in the memory cell 30 of FIG. 5, and the conductive line 335_5 and the via 230_4 are made of the same material in the memory cell 40 of FIG. 9. In some embodiments, the conductive line 335_5 and the via 230_4 in the memory cell 30 of FIG. 5 are formed in a single damascene process, and the conductive line 335_5 and the via 230_4 in the memory cell 40 of FIG. 9 are formed in a dual damascene process.

In the memory cell 40, the continuous via-plugs 360_1 is disposed in the metallization layer level M2 and the via level via_1 of the IMD layer 450, the metallization layer level M1 of the IMD layer 440, and the via level via_0 of the IMD layer 430. Furthermore, the continuous via-plug 360_1 is over the contact 220_3. In other words, the continuous via-plug 360_1 is directly landed on the contact 220_3 without the vias in the via levels via_1 and via_0, and the conductive lines in the metallization layer levels M1 and M2. Thus, compared with the continuous via-plug 330_2 in the memory cell 30 of FIG. 5, the continuous via-plug 360_1 in the memory cell 40 of FIG. 9 has a greater depth.

Figure 10:
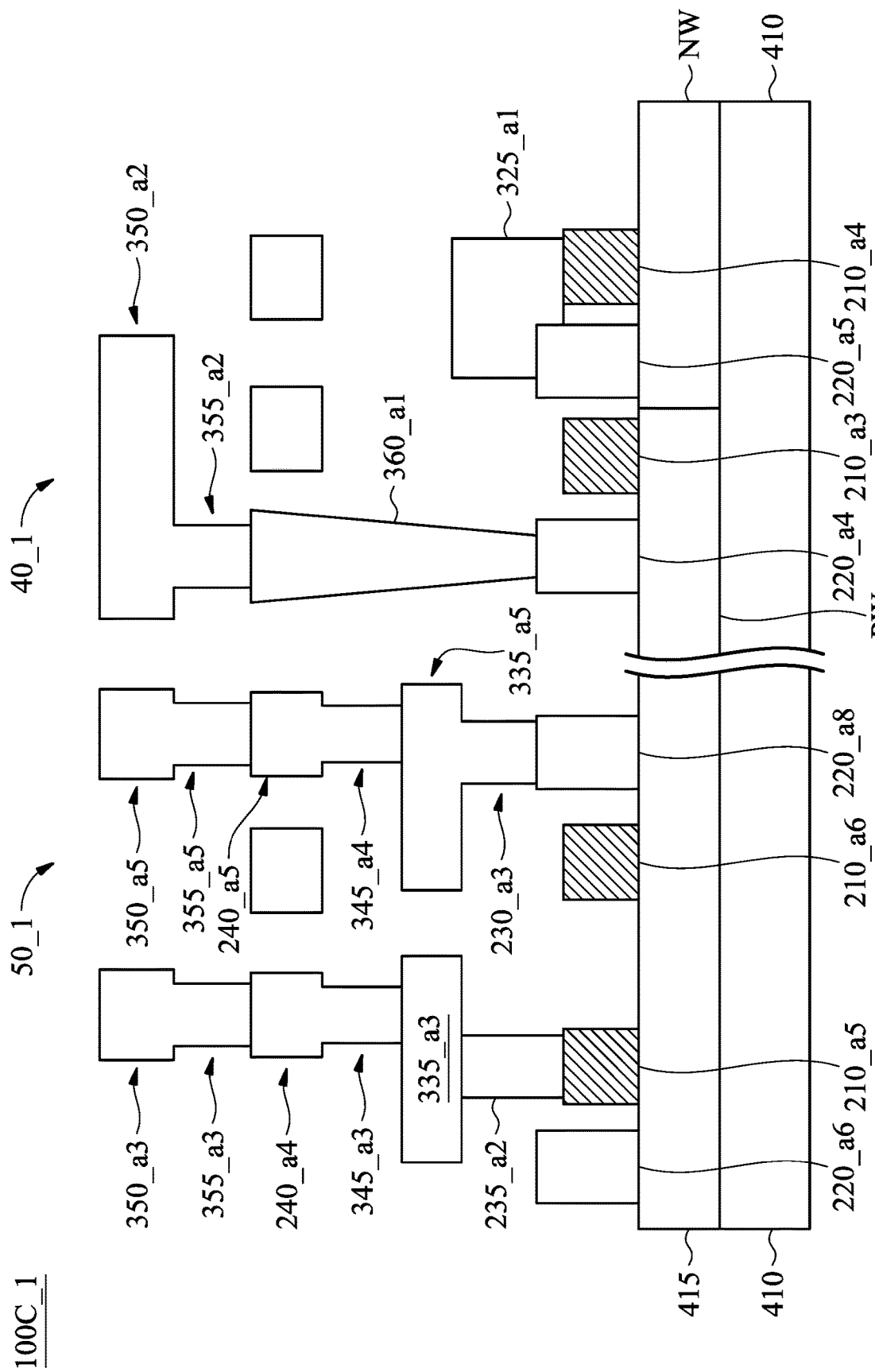
FIG. 10 illustrates a cross-sectional view of the semiconductor structure of an IC, in accordance with some embodiments of the disclosure.

FIG. 10 illustrates a cross-sectional view of the semiconductor structure of an IC 100C_1, in accordance with some embodiments of the disclosure. The IC 100C_1 includes multiple logic cells 50_1 forming a third circuit (e.g., 150 of FIG. 1C) and multiple memory cells 40_1 forming a second memory (e.g., 140 of FIG. 1C).

In the memory cell 40_1, a P-type well region PW and an N-type well region NW is formed over a substrate 410. The source/drain contact 220_a4 and the gate electrode 210_a3 are positioned over the P-type well region PW, and the source/drain contact 220_a5 and the gate electrode 210_a4 are positioned over the N-type well region NW.

In the memory cell 40_1, the gate electrode 210_a4 is electrically connected to the source/drain contact 220_a5 through the via 325_a1 of the via level via_0. In some embodiments, the via 325_a1 is a butt via, and includes a first portion over, and electrically connected to, the gate electrode 210_a4, and a second portion over, and electrically connected to, the source/drain contact 220_a5. In other words, the via 325_a1 is a local-connection layer for connecting the gate electrode 210_a4 and the source/drain contact 220_a5. In some embodiments, the via 325_a1, the gate via 235_a1, the via 230_a1 are coplanar, and are made of the same metal material. In some embodiments, the via 325_a1 is used to connect the gate regions of the pull-up transistor PU-1 and the pull-down transistor PD-1 to the drain regions of the pull-up transistor PU-2 and the pull-down transistor PD-2 in the memory cell 40_1. In some embodiments, the via 325_a1 is used to connect the gate regions of the pull-up transistor PU-2 and the pull-down transistor PD-2 to the drain regions of the pull-up transistor PU-1 and the pull-down transistor PD-1 in the memory cell 40_1.

In the memory cell 40_1, the source/drain contact 220_a4 is electrically connected to the conductive line 350_a2 of the metallization layer level M3 through the continuous via-plug 360_a1, and the via 355_a2 of the via level via_2 in sequence. In some embodiments, the conductive line 350_a2 and the via 355_a2 are made of the same material. Furthermore, the contact 220_a4 is used to connect the source region of the pass-gate transistor PG-1/PG-2 in the memory cell 40_1. Therefore, the bit line BL or the complementary bit line BLB is connected to the source region of the pass-gate transistor PG-1/PG-2 through the source/drain contact 220_a4, the continuous via-plug 360_a1, the via 355_a2, and the conductive line 350_a2.

In the logic cell 50_1, a well region 415 is formed over the substrate 410. The source/drain contact 220_a6 and the gate electrode 210_a5 are positioned over the well region 415. In some embodiments, the well region 415 is a P-type well region, and the gate electrodes 210_a5 and 210_a6 are coupled to the gate regions of NMOS transistors in the logic cell 50_1. Furthermore, the contacts 220_a6 and 220_a7 are coupled to the source/drain regions of NMOS transistors in the logic cell 50_1. In some embodiments, the well region 415 is an N-type well region, and the gate electrodes 210_a5 and 210_a6 are coupled to the gate region of PMOS transistor in the logic cell 50_1. Furthermore, the contacts 220_a6 and 220_a7 are coupled to the source/drain regions of PMOS transistors in the logic cell 50_1.

In the logic cell 50_1, the gate electrode 210_a5 is electrically connected to the conductive line 350_a3 of the metallization layer level M3 through the gate via 235_a2 of the via level via_0, the conductive line 335_a3 of the metallization layer level M1, the via 345_a3 of the via level via_1, the conductive line 240_a4 of the metallization layer level M2, and the via 355_a3 of the via level via_2 in sequence. In some embodiments, the conductive line 350_a3 and the via 355_a3 are made of the same material, the conductive line 240_a4 and the via 345_a3 are made of the same material, and the conductive line 335_a3 and the gate via 235_a2 are made of different materials.

In the logic cell 50_1, the contact 220_a8 is electrically connected to the conductive line 350_a5 of the metallization layer level M3 through the via 230_a3 of the via level via_0, the conductive line 335_a5 of the metallization layer level M1, the via 345_a4 of the via level via_1, the conductive line 240_a5 of the metallization layer level M2, and the via 355_a5 of the via level via_2 in sequence. In some embodiments, the conductive line 350_a5 and the via 355_a5 are made of the same material, the conductive line 240_a5 and the via 345_a4 are made of the same material, and the conductive line 335_a5 and the via 230_a3 are made of the same material.

In some embodiments, the conductive line 350_a5 and the via 355_a5 are formed in a dual damascene process, the conductive line 240_a5 and the via 345_a4 are formed in a dual damascene process, and the conductive line 335_a5 and the via 230_a3 are formed in a dual damascene process.

In the IC 100C_1, no continuous via-plug is used to connect the conductive line of the metallization layer level M3 to the via of the via level via_1 of via_0 in the logic cell 50_1. In some embodiments, the continuous via-plug 360_a1 are made of a metal material, such as a single tungsten (W) plug. In some embodiments, the continuous via-plug 360_a1 are made of a metal material without a barrier metal layer. In some embodiments, the material of the continuous via-plugs 360_a1 is selected from a group consisting of Ti, TiN, Pt, Co, Ru, W, TaN, Cu, and a combination thereof.

In some embodiments, the conductive lines 350_a3, 350_a5 and 350_a2 and the vias 355_a3, 355_a5 and 355_a2 include the Cu-based material, and the conductive lines 335_a3 and 335_a5 and the vias 235_a2, 230_a3 and 325_a1 include the Co-based material.

In the IC 100C_1, the continuous via-plug 360_a1 is used to replace the multiple stacked connection (e.g., the via of the via levels via_1 and via_0 and the via levels M1 and M2), thereby bit-line capacitance of the memory cell 40_1 is decreased.

Embodiments for semiconductor structures are provided. In the memory cells of an IC, the bit line BL and the complementary bit line BLB are arranged in the metallization layer level M3. A continuous via-plug is used to connect the bit line BL and the complementary bit line BLB, thereby bit-line capacitance and the resistances of the complementary bit line BLB and the bit line BL of the memory cell are decreased. Thus, IR drop in the bit line BL and complementary bit line BLB is decreased during write cycle in write margin, and RC delay is decreased due to lower line resistance in the bit line BL and complementary bit line BLB. Thus, array efficiency and speed are increased in the memory cell. Furthermore, the continuous via-plugs are used in the logic cells, so as to decrease routing in the metallization layer level M2, thereby improving routing density in the logic cell.

In some embodiments, a semiconductor structure is provided. The semiconductor structure includes a memory cell formed over a semiconductor substrate. The memory cell includes a latch circuit formed by two cross-coupled inverters and a pass-gate transistor coupling an output of the latch circuit to a bit line. Each of the cross-coupled inverters is electrically connected to a VDD line formed in a first metallization layer. A word line formed in a second metallization layer is electrically connected to a gate of the pass-gate transistor through a first via over the gate of the pass-gate transistor, a first landing pad formed in the first metallization layer, and a second via over the first landing pad. A first source/drain region of the pass-gate transistor is electrically connected to the bit line formed in a third metallization layer through a contact over the first source/drain region, a third via over the contact, a continuous via-plug over the third via, and a fourth via over the continuous via-plug. The continuous via-plug penetrates the first and second metallization layers.

In some embodiments, a semiconductor structure is provided. The semiconductor structure includes a memory cell formed over a semiconductor substrate and a logic cell comprising a transistor over the semiconductor substrate. The memory cell includes a latch circuit formed by two cross-coupled inverters, and a pass-gate transistor coupling an output of the latch circuit to a bit line. Each of the cross-coupled inverters is electrically connected to a VDD line formed in a first metallization layer. A word line formed in a second metallization layer is electrically connected to a gate of the pass-gate transistor through a first via over the gate of the pass-gate transistor, a first landing pad formed in the first metallization layer, and a second via over the first landing pad. A first source/drain region of the pass-gate transistor is electrically connected to the bit line formed in a third metallization layer through a contact over the first source/drain region, a third via over the contact, a first continuous via-plug over the third via, and a fourth via over the first continuous via-plug. The first continuous via-plug penetrates the first and second metallization layers. The transistor of the logic cell includes a second source/drain region extending from a channel region. The second source/drain region is electrically connected to a power line through a fifth via over the second source/drain region, a second landing pad formed in the first metallization layer, a second continuous via-plug over the second landing pad, and a sixth via over the second continuous via-plug. The height of the first continuous via-plug is greater than that of the second continuous via-plug.

In some embodiments, a semiconductor structure is provided. The semiconductor structure includes a memory cell formed over a semiconductor substrate. The memory cell includes a latch circuit formed by two cross-coupled inverters, and a pass-gate transistor coupling an output of the latch circuit to a bit line. Each of the cross-coupled inverters is electrically connected to a VDD line formed in a first metallization layer. A word line formed in a second metallization layer is electrically connected to a gate of the pass-gate transistor through a first via over the gate of the pass-gate transistor, a first landing pad formed in the first metallization layer, and a second via over the first landing pad. A first source/drain region of the pass-gate transistor is electrically connected to the bit line formed in a third metallization layer through a contact over the first source/drain region, a continuous via-plug over the first contact, and a third via over the continuous via-plug. The continuous via-plug penetrates the first and second metallization layers.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a memory cell formed over a semiconductor substrate, comprising:
      a latch circuit formed by two cross-coupled inverters; and
      a pass-gate transistor coupling an output of the latch circuit to a bit line,
   wherein each of the cross-coupled inverters is electrically connected to a VDD line formed in a first metallization layer,
   wherein a word line formed in a second metallization layer is electrically connected to a gate of the pass-gate transistor through a first via over the gate of the pass-gate transistor, a first landing pad formed in the first metallization layer, and a second via over the first landing pad,
   wherein a first source/drain region of the pass-gate transistor is electrically connected to the bit line formed in a third metallization layer through a contact over the first source/drain region, a third via over the contact, a continuous via-plug over the third via, and a fourth via over the continuous via-plug,
   wherein the continuous via-plug penetrates the first and second metallization layers.

2. The semiconductor structure as claimed in claim 1, wherein the third via and the continuous via-plug are formed of a single tungsten plug.

3. The semiconductor structure as claimed in claim 1, wherein the contact has a rectangular shape, and a dimension ratio of a longer side to a shorter side of the contact is greater than 1.2.

4. The semiconductor structure as claimed in claim 1, wherein the third via has a rectangular shape, and a dimension ratio of a longer side to a shorter side of the contact is greater than 1.2.

5. The semiconductor structure as claimed in claim 1, wherein the continuous via-plug has an elliptical shape, and a dimension ratio of a longer axis to a shorter axis of the continuous via-plug is less than 1.2.

6. The semiconductor structure as claimed in claim 1, wherein material of the continuous via-plug is selected from a group consisting of Ti, TiN, Pt, Co, Ru, W, TaN, Cu and a combination thereof.

7. The semiconductor structure as claimed in claim 1, wherein the second via and the word line are made of the same material, the bit line and the fourth via are made of the same material, and the first and third vias, the VDD line and the first landing pad are made of different materials.

8. The semiconductor structure as claimed in claim 1, wherein a second source/drain region of the pass-gate transistor is electrically connected to gate electrodes of one of the cross-coupled inverters through a local-connection layer that is coplanar and is made of the same metal material as the first and third vias.

9. A semiconductor structure, comprising:
- a memory cell formed over a semiconductor substrate, comprising:
  - a latch circuit formed by two cross-coupled inverters; and
  - a pass-gate transistor coupling an output of the latch circuit to a bit line,
- wherein each of the cross-coupled inverters is electrically connected to a VDD line formed in a first metallization layer,
- wherein a word line formed in a second metallization layer is electrically connected to a gate of the pass-gate transistor through a first via over the gate of the pass-gate transistor, a first landing pad formed in the first metallization layer, and a second via over the first landing pad,
- wherein a first source/drain region of the pass-gate transistor is electrically connected to the bit line formed in a third metallization layer through a contact over the first source/drain region, a third via over the contact, a first continuous via-plug over the third via, and a fourth via over the first continuous via-plug,
- wherein the first continuous via-plug penetrates the first and second metallization layers; and
- a logic cell comprising a transistor over the semiconductor substrate, wherein the transistor comprises:
  - a second source/drain region extending from a channel region,
  - wherein the second source/drain region is electrically connected to a power line through a fifth via over the second source/drain region, a second landing pad formed in the first metallization layer, a second continuous via-plug over the second landing pad, and a sixth via over the second continuous via-plug,
  - wherein the first continuous via-plug has a height that is greater than that of the second continuous via-plug.

10. The semiconductor structure as claimed in claim 9, wherein the third via and the first continuous via-plug are formed of a single tungsten plug.

11. The semiconductor structure as claimed in claim 9, wherein the word line and the second via are made of Cu-based material, and the first continuous via-plug is made of W-based material.

12. The semiconductor structure as claimed in claim 9, wherein the word line and the second via are made of Co-based material, and the first continuous via-plug is made of W-based material.

13. The semiconductor structure as claimed in claim 9, wherein the second via and the word line are made of the same material, the bit line, the power line and the fourth and sixth vias are made of the same material, and the first, third and fifth vias, the VDD line and the first and second landing pads are made of different materials.

14. The semiconductor structure as claimed in claim 9, wherein a third source/drain region of the pass-gate transistor is electrically connected to gate electrodes of one of the cross-coupled inverters through a local-connection layer that is coplanar and is made of the same metal material as the first and third vias.

15. A semiconductor structure, comprising:
- a memory cell formed over a semiconductor substrate, comprising:
  - a latch circuit formed by two cross-coupled inverters; and
  - a pass-gate transistor coupling an output of the latch circuit to a bit line,
- wherein each of the cross-coupled inverters is electrically connected to a VDD line formed in a first metallization layer,
- wherein a word line formed in a second metallization layer is electrically connected to a gate of the pass-gate transistor through a first via over the gate of the pass-gate transistor, a first landing pad formed in the first metallization layer, and a second via over the first landing pad,
- wherein a first source/drain region of the pass-gate transistor is electrically connected to the bit line formed in a third metallization layer through a contact over the first source/drain region, a continuous via-plug over the first contact, and a third via over the continuous via-plug,
- wherein the continuous via-plug penetrates the first and second metallization layers.

16. The semiconductor structure as claimed in claim 15, wherein the continuous via-plug is formed of a single tungsten plug.

17. The semiconductor structure as claimed in claim 15, wherein material of the continuous via-plug is selected from a group consisting of Ti, TiN, Pt, Co, Ru, W, TaN, Cu and a combination thereof.

18. The semiconductor structure as claimed in claim 15, wherein the second via and the word line are made of the same material, the bit line and the third via are made of the same material, and the first via, the VDD line and the first landing pad are made of the same material.

19. The semiconductor structure as claimed in claim 15, wherein the first contact has a rectangular shape, and a dimension ratio of a longer side to a shorter side of the first contact is greater than 1.2.

20. The semiconductor structure as claimed in claim 15, wherein the first landing pad and the first via are made of Co-based metal material, and the bit line and the third via are made of Cu-based metal material.

* * * * *